(12) United States Patent
Sergenese et al.

(10) Patent No.: US 10,072,817 B2
(45) Date of Patent: Sep. 11, 2018

(54) USING WHITE LEDS TO ENHANCE INTENSITY OF COLORED LIGHT FROM COLORED LEDS

(71) Applicant: SWS Warning Systems Inc., Niagara Falls (CA)

(72) Inventors: Steven A. Sergenese, Niagara Falls (CA); Jerico Wong, St. Catharines (CA); Rainier Chua, Niagara Falls (CA); Umer Anwer, Niagara Falls (CA)

(73) Assignee: SWS WARNING SYSTEMS INC., Ontario (CA)

( * ) Notice: Subject to any disclaimer, the term of this patent is extended or adjusted under 35 U.S.C. 154(b) by 68 days.

(21) Appl. No.: 15/087,941

(22) Filed: Mar. 31, 2016

(65) Prior Publication Data
US 2017/0284630 A1    Oct. 5, 2017

(51) Int. Cl.
| | |
|---|---|
| *F21V 9/00* | (2018.01) |
| *F21V 5/04* | (2006.01) |
| *F21V 19/00* | (2006.01) |
| *H05K 3/34* | (2006.01) |
| *F21Y 113/13* | (2016.01) |
| *F21Y 115/10* | (2016.01) |

(52) U.S. Cl.
CPC ............. *F21V 5/045* (2013.01); *F21V 9/00* (2013.01); *F21V 19/0025* (2013.01); *H05K 3/341* (2013.01); *H05K 3/3452* (2013.01); *H05K 3/3484* (2013.01); *H05K 3/3494* (2013.01); *F21Y 2113/13* (2016.08); *F21Y 2115/10* (2016.08); *H05K 2203/041* (2013.01)

(58) Field of Classification Search
CPC .............. F21Y 2113/10; F21Y 2113/13; F21Y 2113/17
See application file for complete search history.

(56) References Cited

U.S. PATENT DOCUMENTS

| | | | |
|---|---|---|---|
| 7,118,261 B2 | 10/2006 | Fredericks et al. | |
| 9,016,896 B1 * | 4/2015 | Roudeski | F21V 7/04 340/953 |
| 2014/0254127 A1 * | 9/2014 | Tan | F21V 9/08 362/84 |

* cited by examiner

*Primary Examiner* — Sean Gramling
(74) *Attorney, Agent, or Firm* — Knobbe, Martens, Olson & Bear, LLP

(57) ABSTRACT

The present disclosure describes light systems in which the intensity of base color LEDs configured to emit light within a target color region is increased using additional white LEDs and the emitted light is filtered so that a dominant portion of light passing through the filter at a particular viewing angle is within the target color region. The present disclosure also describes methods for forming a printed circuit board with an integral heat sink arrangement by depositing additional solder on solder pads that are not used to connect electronic components so that the additional solder acts as a heat sink.

9 Claims, 30 Drawing Sheets

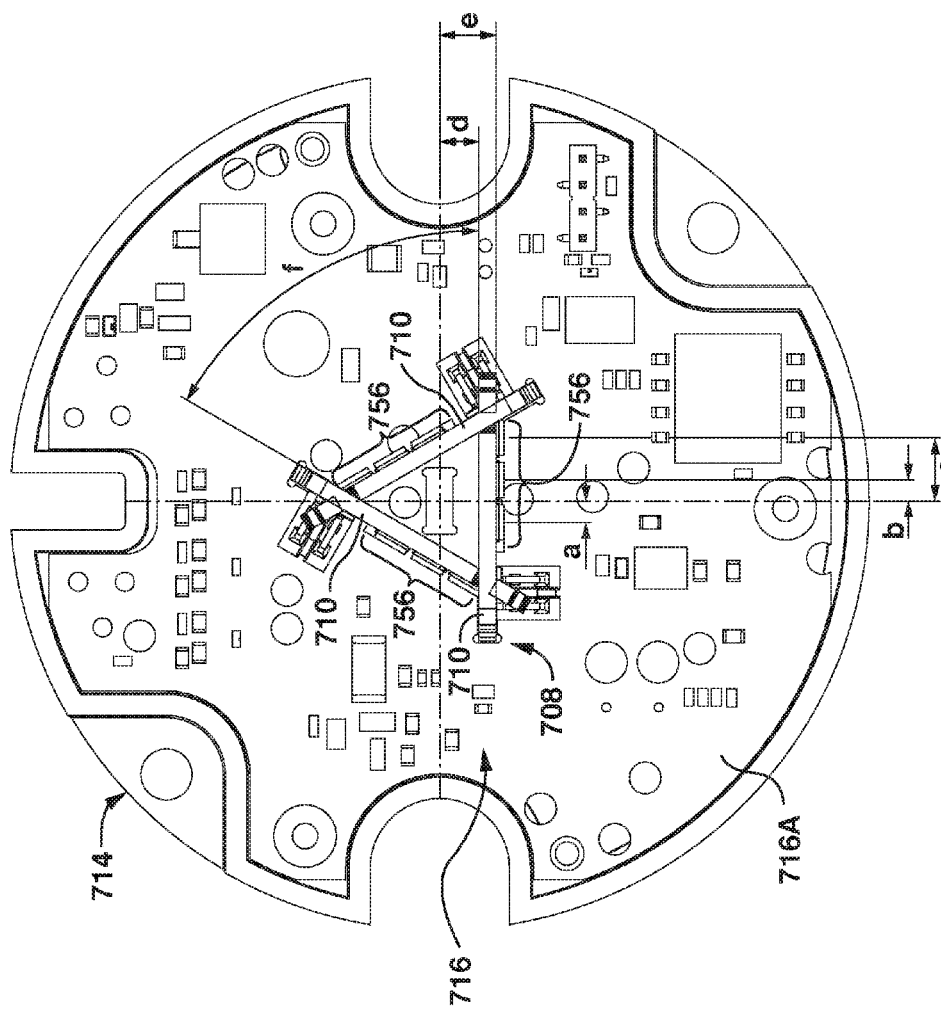

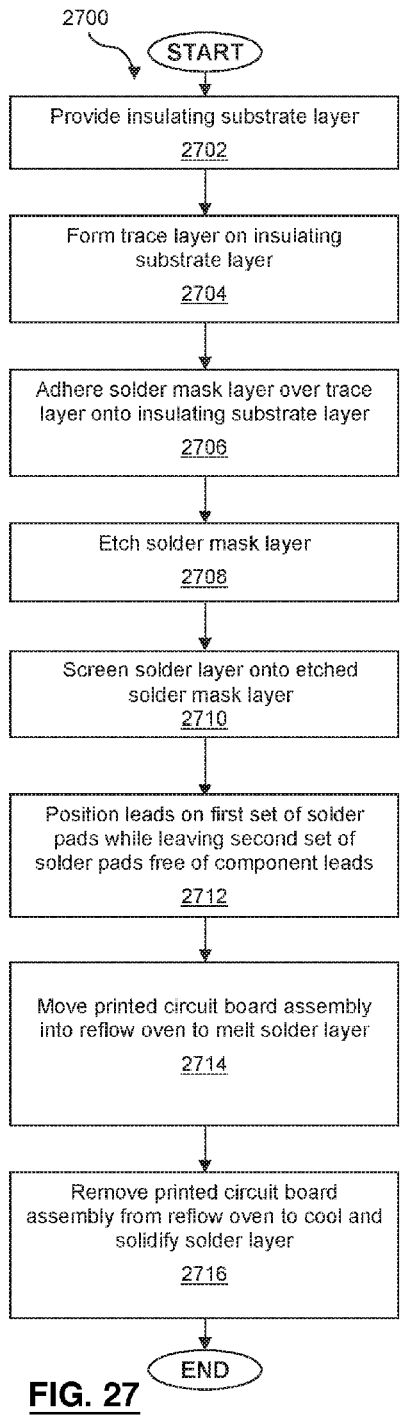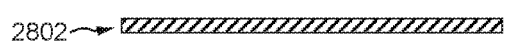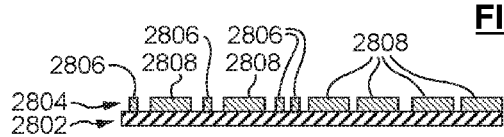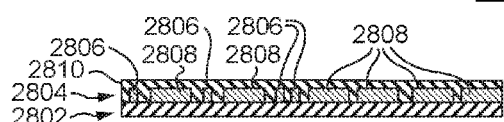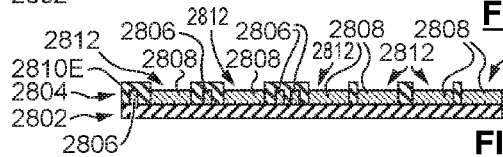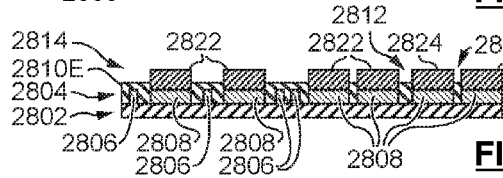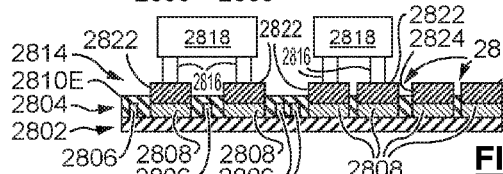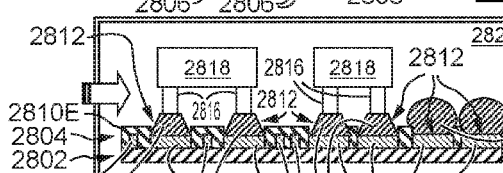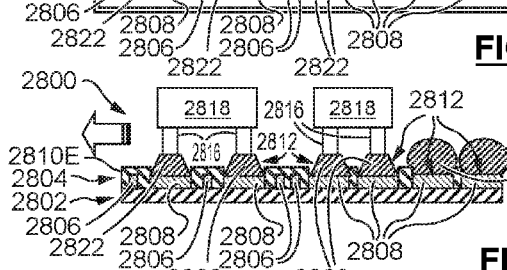

USING WHITE LEDS TO ENHANCE INTENSITY OF COLORED LIGHT FROM COLORED LEDS

TECHNICAL FIELD

The present disclosure relates to light emitting diode (LED) lighting systems, and more particularly to color mixing in LED lighting systems.

BACKGROUND

The SAE J845 (2013) Class 1 standard is a certification standard for 360° emitting warning light systems (i.e. so-called "flashing lights"), and includes mechanical, electrical, and optical tests, and is incorporated herein by reference. The SAE J845 (2013) Class 1 standard includes a color test (SAE J578) which involves the use of a spectrophotometer to yield International Commission on Illumination (CIE) (x,y) coordinates based upon the CIE (1931) standard colorimetric system while the light is in its standard mounted position. The SAE J578 test requires that the light emitted by the light system fall within predetermined boundaries depending upon its intended output color; the regions enclosed by these boundaries are referred to herein as "target color regions". If the light emitted by a light system does not fall within the relevant target color region or shifts out of the target color region during a 30 minute "warm-up" period, it immediately fails the test and therefore cannot be classified under the SAE standard.

FIG. 1 is a graph 100 representing the CIE (1931) standard colorimetric system, with the SAE J578 specifications for red, yellow (amber), green, and blue (including restricted blue and signal blue) target color regions 110, 120, 130, 140 (140A, 140B) respectively, superimposed thereon. FIG. 1 also shows the white color region 170 superimposed on the graph representing the CIE (1931) standard colorimetric system. Thus, the term "white color region", as used herein, refers to the white color region 170 as shown in FIG. 1. The red, yellow (amber), green, and blue (including restricted blue and signal blue) target color regions 110, 120, 130, 140 (140A, 140B), respectively, are "non-white target color regions".

For the red target color region 110, the SAE J578 standard requires that the color of light emitted from the device shall fall within the boundaries y=0.335 (yellow boundary) and y=0.980−x (purple boundary), with the remaining boundaries formed by the boundaries of the CIE (1931) color space itself, namely outer curve 150 and lower linear bound 160. This translates to the following set of approximate coordinates defining the boundaries of the red target color region:

| X | Y |
|---|---|
| 0.72 | 0.259 |
| 0.73 | 0.265 |
| 0.66 | 0.335 |
| 0.645 | 0.335 |

For the yellow (amber) target color region 120, the SAE J578 standard requires that the color of light emitted from the device shall fall within the boundaries y=0.390 (red boundary), y=0.790−0.670x (white boundary) and y=x−0.120 (green boundary), with the remaining boundary formed by the outer curve 150 of the CIE (1931) color space itself. This translates to the following set of approximate coordinates defining the boundaries of the yellow (amber) target color region:

| X | Y |
|---|---|
| 0.59 | 0.39 |
| 0.62 | 0.39 |
| 0.56 | 0.44 |
| 0.54 | 0.42 |

For the green target color region 130, the SAE J578 standard requires that the color of light emitted from the device shall fall within the boundaries y=0.730−0.730x (yellow boundary), x=0.630y−0.040 (white boundary) and y=0.500−0.500x (blue boundary), with the remaining boundary formed by the outer curve 150 of the CIE (1931) color space itself. This translates to the following set of approximate coordinates defining the boundaries of the green target color region:

| X | Y |
|---|---|
| 0.025 | 0.725 |
| 0.275 | 0.525 |
| 0.210 | 0.395 |
| 0.025 | 0.490 |

The SAE J578 standard divides the blue target color region 140 into a "restricted blue" target color region 140A and a "signal blue" target color region 140B. Light should fall within the restricted blue target color region 140A when recognition of blue as such is necessary; where it is not necessary to identify blue as such, blue light may fall anywhere within the restricted blue target color region 140A or the signal blue target color region 140B. For the restricted blue target color region 140A, the SAE J578 standard requires that the color of light emitted from the device shall fall within the boundaries y=0.070+0.810x (green boundary), x=0.400−y (white boundary) and x=0.130+0.600y (violet boundary), with the remaining boundary formed by the outer curve 150 of the CIE (1931) color space itself. For the signal blue target color region 140B, the SAE J578 standard requires that the color of light emitted from the device shall fall within the boundaries y=0.320 (green boundary), x=0.160 (white boundary), x=0.400−y (white boundary) and x=0.130+0.600 (violet boundary), with the remaining boundaries formed by the border with the restricted blue region 140A and the outer curve 150 of the CIE (1931) color space itself. This translates to the following set of approximate coordinates defining the boundaries of the overall blue target color region:

| X | Y |
|---|---|
| 0.14 | 0.03 |
| 0.23 | 0.17 |
| 0.16 | 0.23 |
| 0.16 | 0.32 |
| 0.04 | 0.32 |

For the white color region 170, the SAE J578 standard requires that the color of light shall fall within the boundaries x=0.300 (blue boundary), x=0.500 (yellow boundary), y=0.150+0.640x (green boundary), y=0.050+0.750x (purple boundary), y=0.440 (green boundary) and y=0.380 (red boundary). This translates to the following set of approximate coordinates defining the boundaries of the white color region:

| X | Y |
|---|---|
| 0.31 | 0.28 |
| 0.44 | 0.38 |
| 0.50 | 0.38 |
| 0.50 | 0.44 |
| 0.45 | 0.44 |
| 0.31 | 0.34 |

Conventional LED light systems utilize narrow color-band LEDs that typically use two primary material compositions: Aluminum-Indium-Gallium-Phosphide (GaP) and Indium-Gallium-Nitride (GaN). These two compositions yield several very distinct pure colors with narrow bandwidths, which are expressed as the wavelength of the color in nanometers (nm). FIG. 2 is a graph 200 that shows the bandwidths for royal blue 210, blue 220, cyan 230, green 240, yellow (amber) 250, red/orange 260, red 270 and deep red 280; the bandwidths and wavelength ranges for red, red-orange, yellow (amber), green, cyan and blue are also shown in Table 1 below. These wavelengths of pure color define the outer curve 150 of the CIE (1931) color space illustrated by the graph 100 in FIG. 1.

TABLE 1

Typical Traditional LED material composition yield

| Material Composition | Color | Wavelength Range | Bandwidth |
|---|---|---|---|
| Aluminum-Indium-Gallium-Phosphide | Red | 620-645 nm | 25 nm |
| Aluminum-Indium-Gallium-Phosphide | Red-Orange | 610-620 nm | 10 nm |
| Aluminum-Indium-Gallium-Phosphide | Yellow (Amber) | 580-595 nm | 15 nm |
| Indium-Gallium-Nitride | Green | 520-540 nm | 20 nm |
| Indium-Gallium-Nitride | Cyan | 490-515 nm | 25 nm |
| Indium-Gallium-Nitride | Blue | 460-485 nm | 25 nm |

White LEDs utilize a phosphor on a blue LED, which converts the blue light into a wide spectrum white output consisting of various wavelengths of light. FIG. 3 is a graph 300 that shows the spectrum outputs for a 5000K-10000K correlated color temperature (CCT) white LED 310, a 3700K-5000K CCT white LED 320 and a 2600K-3700K CCT white LED 330.

GaP and GaN LEDs work well at producing the required color output (i.e. the color of the light falls within the desired target color region), but suffer from certain disadvantages. Blue LEDs do not have very high optical intensity, and GaP LEDs suffer from intensity loss and a larger color shift due to heat at a much higher level than GaN LEDs. FIG. 4 is a graph 400 that shows the thermal degradation of typical pure color GaP, GaN and white LEDs, with lines for yellow (amber) 410, red-orange and red 420, green 430, blue 440 and white 450. The thermal degradation results in the need for multiple LEDs and/or a large (typically metal) heat sink, which will increase the cost of the light system. Also, GaP LEDs typically have a lower forward voltage (2.0V-2.5V) compared to GaN LEDs (3.0V-3.5V), thus requiring different electronic setups to accommodate various colors.

As noted above, white LEDs utilize a phosphor on a blue LED to convert the blue light into a wide spectrum white output consisting of various wavelengths of light. The output can be adjusted to change the color temperature of the white as per the standard blackbody curve by thickening or thinning the phosphor, changing the concentration of the phosphor, or changing the material of the phosphor (typically an yttrium-aluminum-garnet material). The wide output spectrum of white LEDs allows for color filtering techniques (e.g. colored lenses) to be employed.

Similar techniques have been employed to create wider band versions of specific color LEDs, primarily amber and certain greens. These phosphor converted (PC) LEDs have a broader bandwidth than the traditional pure color LEDs; FIG. 5 is a graph 500 showing the spectral output for a lime green PC LED 510 and for a yellow (amber) PC LED 520. This broader spectral output also moved the CIE coordinates of the output of the LED inwardly from standard outer curve 150 of the CIE (1931) color space (FIG. 1), but still allowed the light output from the LED to remain in the target color region specified by the SAE J578 standard. It also improved the thermal degradation of intensity issue with common GaP amber LEDs, and increased the forward voltage to a level that is similar to blue LEDs.

The intensity requirements of SAE J845 fall into two categories: (1) optical intensity and (2) optical power, and are color dependent with white requiring higher outputs than amber and amber requiring higher outputs than both red and blue, as shown in Table 2. The "Angle" column refers to the angle relative to a horizontal line between the light source and a notional viewer; thus "0° (H-V)" represents a notional viewer observing the light source along a horizontal line, i.e. as viewed horizontally from a standard operating orientation of the light system.

TABLE 2

Optical Intensity & Optical Power requirements as per SAE J845 Class 1, for each color at the required test points.

| Angle | White | Amber | Red & Blue |
|---|---|---|---|
| 5° Up | 76 cd (1800 cd-sec/min) | 38 cd (900 cd-sec/min) | 19 cd (450 cd-sec/min) |
| 2.5° Up | 338 cd (8100 cd-sec/min) | 169 cd (4050 cd-sec/min) | 84 cd (2025 cd-sec/min) |
| 0° (H-V) | 676 cd (16200 cd-sec/min) | 338 cd (8100 cd-sec/min) | 169 cd (4050 cd-sec/min) |
| 2.5° Down | 338 cd (8100 cd-sec/min) | 169 cd (4050 cd-sec/min) | 84 cd (2025 cd-sec/min) |
| 5° Down | 76 cd (1800 cd-sec/min) | 38 cd (900 cd-sec/min) | 19 cd (450 cd-sec/min) |

Optical intensity measures the average flash intensity of a single flash over a known number of flashes, thus yielding the general peak intensity of the light produced by the light system being tested. The optical power portion takes into account the number of flashes and their intensity as it changes during the flash pattern. These two tests not only incorporate the general intensity of the light, but also relate it to the various flash patterns that are present in the light produced by the light system under test. This is important as various patterns have different on times, pulse widths, frequencies, etc. that can affect the optical power of the light output.

As part of the standard test the light systems are allowed to run under normal conditions for 30 minutes before the intensity testing occurs. During this time, the color is still monitored to ensure the color of the light output does not go outside the target color region. The light system is then rotated about its vertical axis, in 10 degree increments, to determine the point having the lowest optical intensity, and then tested from this point. The optical intensity at the test point must fall within 60% of the required minimum to achieve classification. Different minimums are specified for each of Class 1, Class 2 and Class 3 within the SAE J845 standard.

SUMMARY

The present disclosure describes light systems in which the intensity of base color LEDs configured to emit light within a target color region is increased using additional white LEDs and the emitted light is filtered so that a dominant portion of light passing through the filter at a particular viewing angle is within the target color region.

In one aspect, a light system for projecting light within and limited to a non-white target color region comprises a confining primary optic, at least one base color LED and at least one additive LED. The confining primary optic has a focus and a viewing angle range and is configured to direct light from the focus outwardly within the viewing angle range. The base color LED(s) are positioned substantially on the focus and are configured to emit light within the target color region. The additive LED(s) are substantially offset from the focus and are configured to emit light within a white color region for which a CCT of the light within the white color region is skewed toward the target color region. A filter is interposed between the LEDs and a notional viewer. The filter is configured to suppress light outside of the target color region and a dominant portion of filtered light passing through the filter to the notional viewer at a midpoint of the viewing angle range is within the target color region.

The light system may further comprise a control circuit coupled to the LEDs for flashing the LEDs.

In some embodiments, the additive LEDs comprise at least one pair of additive LEDs, with each pair of additive LEDs associated with and positioned adjacent to a respective base color LED. Within each pair of additive LEDs, one member of the pair is disposed with its optical center on a first side of the focus and the other member of the pair is disposed with its optical center on a second side of the focus opposite the first side of the focus. In particular embodiments, within each pair of additive LEDs, each member of the pair has identical photometric output and each member of the pair is disposed with its optical center equidistant from the focus.

In some embodiments, the primary optic is a reflector. In other embodiments, the primary optic is a Fresnel lens, and in particular embodiments the filter may be integral with the Fresnel lens.

Preferably, all of the light emitted from the at least one base color LED is entirely within the target color region. Also preferably, all of the light emitted from the at least one additive LED is entirely within the white color region.

In another aspect, a method for projecting light within and limited to a non-white target color region comprises emitting colored light within the target color region from at least one base color LED, emitting white light within a white color region from at least one additive LED, with the white light having a CCT skewed toward the target color region, and directing the colored light and the white light through a filter toward a notional viewer to produce filtered light. The filter suppresses any portions of the colored light and the white light that are outside of the target color region so that a dominant portion of the filtered light reaching the notional viewer is within the target color region.

In some embodiments, emitting the colored light and emitting the white light is carried out by flashing the LEDs.

The colored light and the white light may be directed through the filter toward the notional viewer by a primary optic, and in some embodiments the filter may be integral to the primary optic. In some embodiments the primary optic may be a reflector. In other embodiments the primary optic may be a Fresnel lens, and in some such embodiments the filter may be integral with the Fresnel lens.

Preferably, all of the light emitted from the at least one base color LED is entirely within the target color region, and all of the light emitted from the at least one additive LED is entirely within the white color region.

The present disclosure also describes methods for forming a printed circuit board with an integral heat sink arrangement by depositing additional solder on solder pads that are not used to connect electronic components so that the additional solder acts as a heat sink.

In one aspect, a method for forming a printed circuit board having a heat sink comprises screening a solder layer onto an etched solder mask layer on an insulating substrate layer. The etched solder mask layer is adhered over a trace layer on the insulating substrate layer so that the solder layer adheres to solder pads on the trace layer, the solder pads being portions of the trace layer that are exposed by openings in the etched solder mask layer, and the solder layer forms a plurality of discrete individual solder portions spaced apart and separate from one another. The method further comprises positioning leads of at least one electronic component on a first set of the solder portions while leaving a second set of the solder portions free of any electronic component leads, and then moving the insulating substrate layer, with the trace layer, the etched solder mask, the solder layer and the at least one electronic component thereon, into a reflow oven to melt the solder layer whereby the solder forming the first set of the solder portions flows between the leads and the respective solder pads. The method further comprises removing the insulating substrate layer, with the trace layer, the etched solder mask, the solder layer and the at least one electronic component thereon, from the reflow oven to cool and solidify the solder layer, whereby the solder forming the first set of the solder portions physically and electrically couples the respective leads to the respective solder pads and the solder forming the second set of the solder portions is at least physically and thermally coupled to the respective solder pads.

Preferably, when the solder layer is melted, surface tension of the solder in the second set of the solder portions draws the solder into solder balls, and after cooling and solidifying the solder layer, the solder balls retain their shape.

In another aspect, a printed circuit board comprises an insulating substrate layer and a trace layer disposed on the insulating substrate layer, with the trace layer comprising a plurality of conductive traces and a plurality of solder pads coupled to the conductive traces. A solder mask layer is disposed on the trace layer so that traces in the trace layer are disposed between the substrate layer and the solder mask layer, and the solder mask layer has a plurality of openings therein in registration with the solder pads whereby the solder pads are exposed by the solder mask layer. A plurality of solder portions are bonded to the solder pads. A first set of the solder portions physically and electrically couples leads of at least one electronic component to respective ones of the solder pads, and a second set of the solder portions is free of any electronic component leads.

Preferably, the solder in the second set of solder portions is in the form of solder balls.

BRIEF DESCRIPTION OF THE DRAWINGS

These and other features will become more apparent from the following description in which reference is made to the appended drawings wherein:

FIG. 11 is a top plan view of an LED carrier of the beacon light system of FIG. 7, showing an LED support post and circuit board thereof;

FIG. 27 is a flow chart showing a method for forming a printed circuit board having a heat sink thereon; and FIGS. 28A to 28H schematically illustrate steps of the method of FIG. 27;

DETAILED DESCRIPTION

Figure 1:
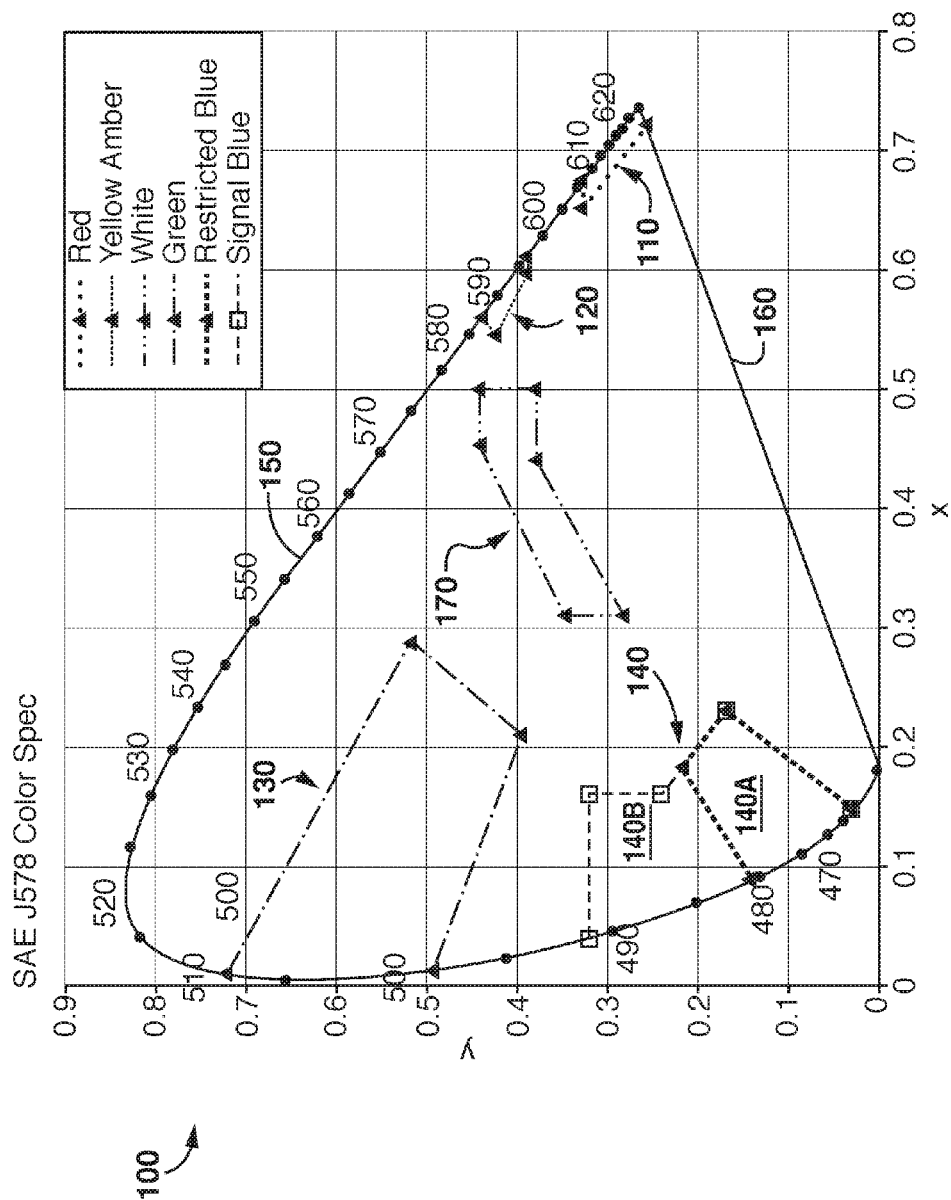
FIG. 1 is a graph representing the CIE (1931) standard colorimetric system, with the SAE J578 specifications for red, yellow (amber), green, and blue (including restricted blue and signal blue) target color regions superimposed thereon.
Figure 2:
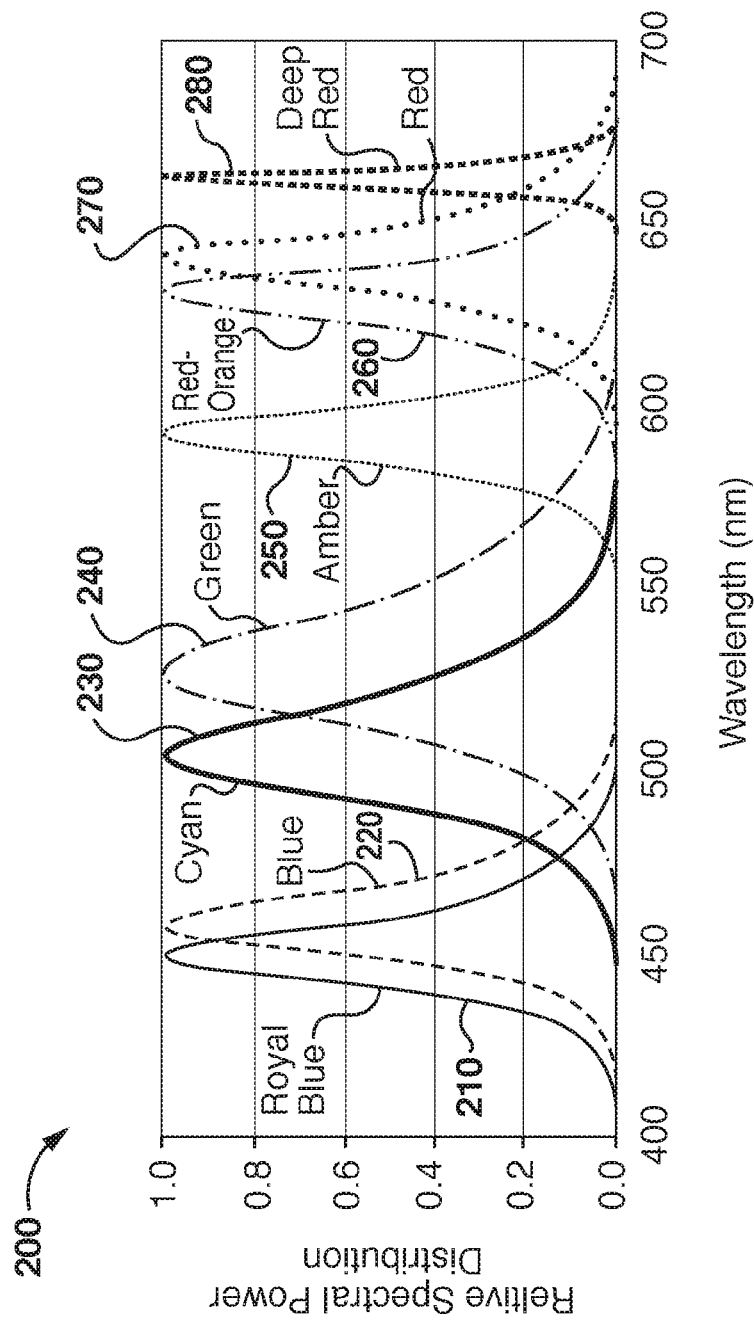
FIG. 2 is a graph that shows bandwidths for royal blue, blue, cyan, green, yellow (amber), red/orange, red and deep red.
Figure 3:
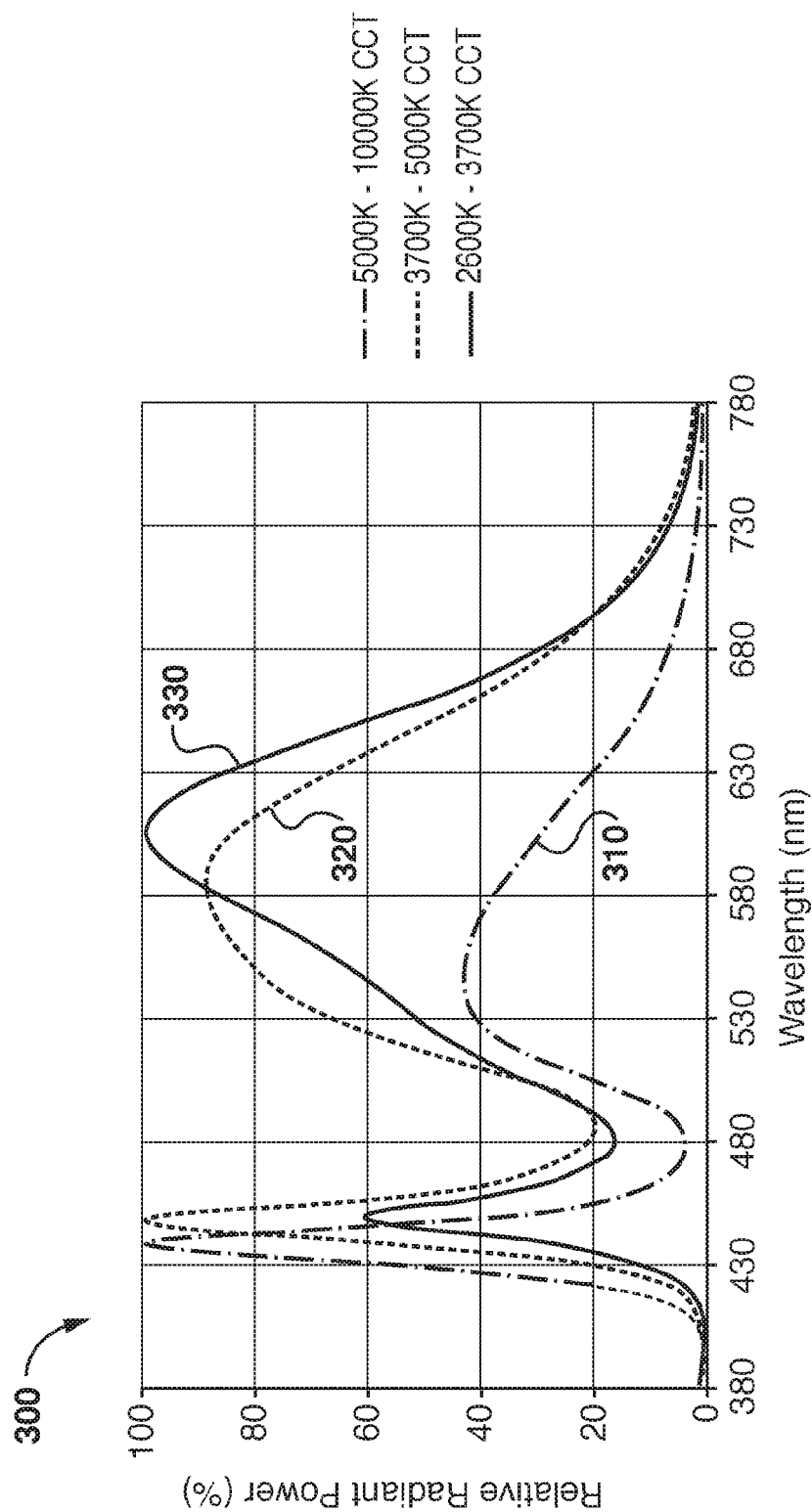
FIG. 3 is a graph that shows the spectrum outputs for a 5000K-10000K correlated color temperature (CCT) white LED, a 3700K-5000K CCT white LED and a 2600K-3700K CCT white LED.
Figure 4:
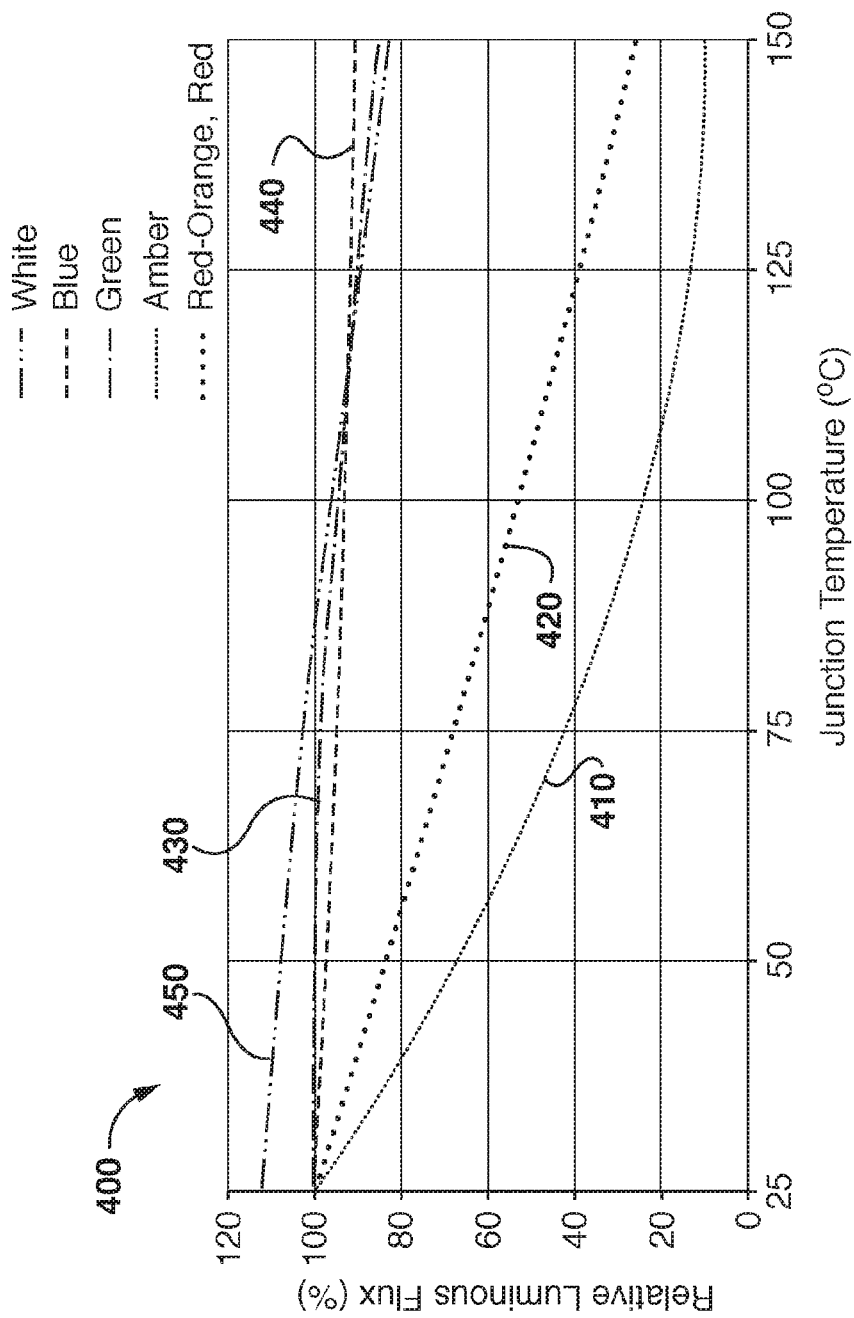
FIG. 4 is a graph that shows the thermal degradation of typical pure color GaP, GaN and white LEDs, with lines for yellow (amber), red-orange and red, green, blue and white.
Figure 5:
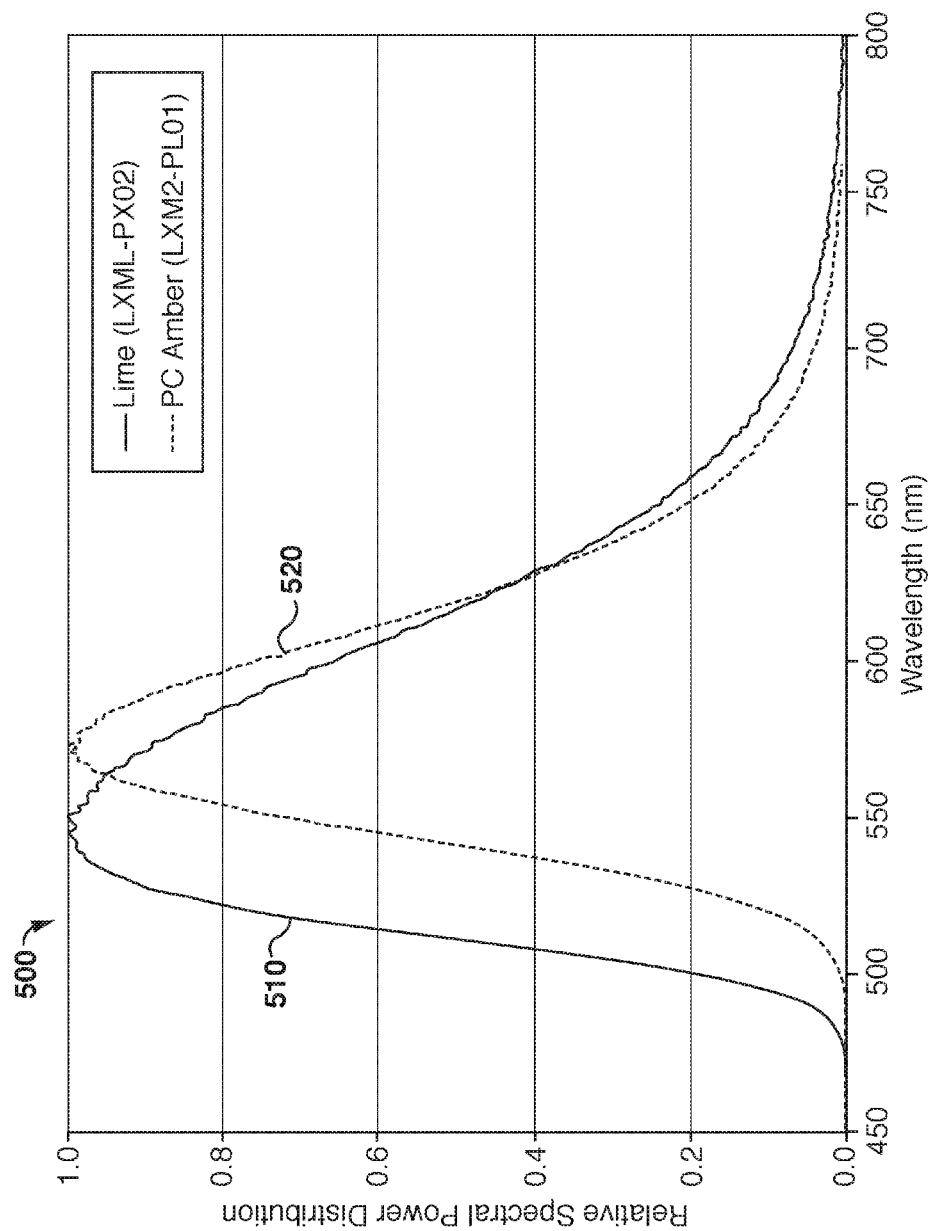
FIG. 5 is a graph showing the spectral output for a lime green PC LED and for a yellow (amber) PC LED.
Figure 6:
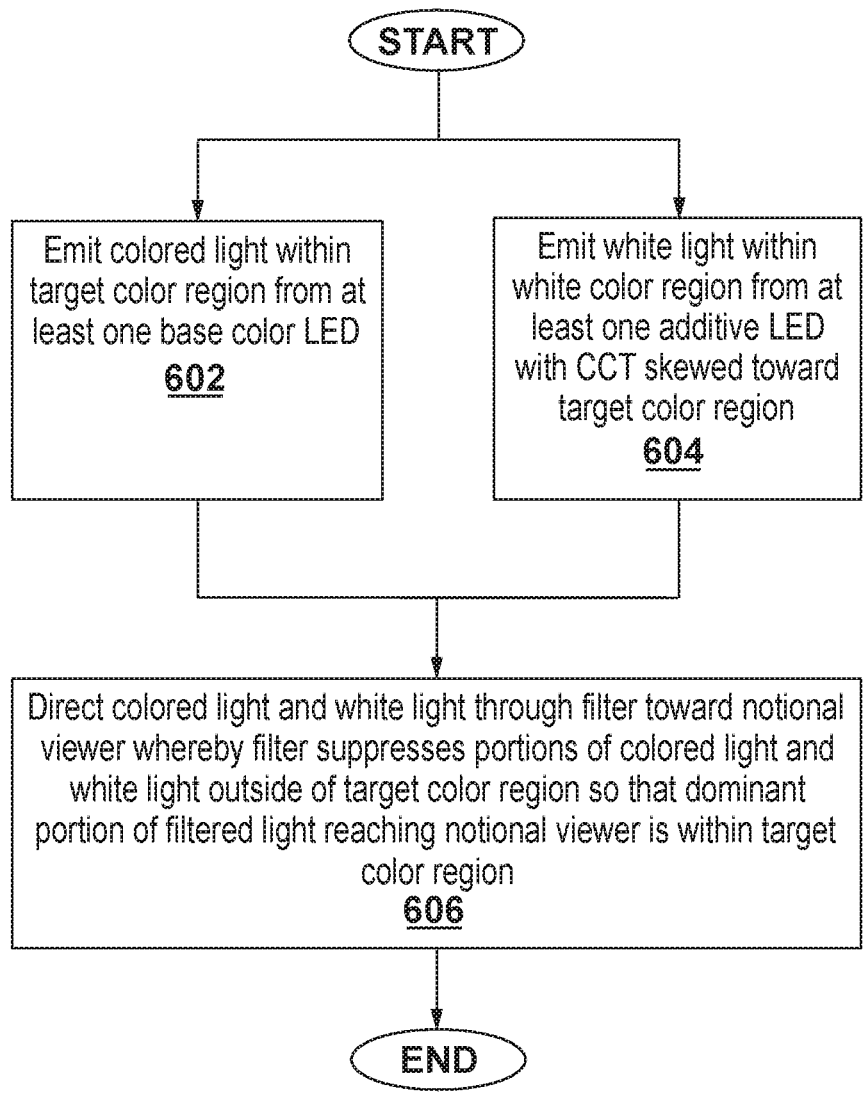
FIG. 6 is a flow chart showing an exemplary method for projecting light within and limited to a non-white target color region.

Broadly speaking, in one aspect the present disclosure is directed to a method 600, shown in flow chart form in FIG. 6, for projecting light within and limited to a non-white target color region, such as the red target color region 110, yellow (amber) target color region 120, green target color region 130, restricted blue target color region 140A or signal blue target color region 140B shown in FIG. 1.

At step 602, colored light within the target color region is emitted from at least one base color LED, and at step 604, white light within the white color region 170 (FIG. 1) is emitted from at least one additive LED. As can be seen, steps 602 and 604 are performed simultaneously. Preferably, all of the light emitted from the base color LED(s) is entirely within the target color region. Similarly, all of the light emitted from the additive LED(s) is preferably entirely within the white color region 170 (FIG. 1). Notably, the white light emitted by the additive LED(s) at step 604 has a CCT skewed toward the target color region. This means using a "warmer" lower CCT white for light systems designed to produce red or yellow (amber) light, and "cooler" higher CCT white for light systems designed to produce green or blue light. Where the target color region is the green target color region 130, restricted blue target color region 140A or signal blue target color region 140B, for the CCT to be skewed toward the target color region the relative radiant power of the white light should have a peak between 380 nm and 480 nm that is greater than its peak between 530 nm and 680 nm. Conversely, where the target color region is the red target color region 110 or yellow (amber) target color region 120, for the CCT to be skewed toward the target color region the relative radiant power of the white light should have a peak between 530 nm and 680 nm that is greater than its peak between 380 nm and 480 nm.

At step 606, the colored light and the white light are directed through a filter toward a notional viewer, and the filter suppresses portions of the colored light and the white light that are outside of the target color region so that the dominant portion of the filtered light reaching the notional viewer is within the target color region. The term "dominant", as used in this context, means that a sufficient portion of the light reaching a particular location is within the target color region for a spectrophotometer positioned at that location to categorize the light as being within the target color region.

At step 606, the light may be directed, for example, using a suitable primary optic. The filter may be integrated into the primary optic or the filter may be separate, for example as part of a secondary optic or an outer enclosure. Generally, the base color LEDs should be substantially on the focus of the primary optic (i.e. focal line or focal plane), and the additive LEDs should be substantially offset from the focus. An LED will be considered to be substantially on the focus of the primary optic (i.e. focal line or focal plane) where (a) the emitting surface of the LED intersects the focus; and (b) the optical center of the emitting surface of the LED is no further from the focus than fifty percent (50%) of the shortest distance between the optical center and the outer edge of the emitting surface of the LED. Conversely, an LED whose emitting surface does not intersect the focus, or an LED whose emitting surface intersects the focus but where the optical center is further from the focus than fifty percent (50%) of the shortest distance between the optical center and the outer edge of the emitting surface, is considered to be substantially offset from the focus of the primary optic. Preferably, the optical centers of the emitting surfaces of the base color LEDs are no further from the focus than forty percent (40%) of the shortest distance between the optical center and the outer edge of the emitting surface, more preferably no further from the focus than thirty percent (30%) of this distance, still more preferably no further from the focus than twenty percent (20%) of this distance and yet still more preferably no further from the focus than ten percent (10%) of this distance. Although the additive LEDs are substantially offset from the focus, the additive LEDs should still be close enough to the focus to increase the intensity within the viewing angle range but far enough from the focus to limit color dilution. When so positioned, the additive LEDs add to the intensity of the light produced by the light system (as compared to the intensity of the base color LEDs alone), but are far enough from the focus that their adverse effect on the detected output color is attenuated by the filter so as to maintain the detected output color within the target color region. While the filter will necessarily reduce intensity to some extent and no filter would be needed were only base color LEDs to be used, appropriate selection of additive LEDs and filter parameters can result in a net increase in intensity while maintaining the detected output light within the target color region. Generally, white LEDs are less costly than colored LEDs, so, without promising any particular utility, an arrangement in which (additive) LEDs are substituted for colored (base) LEDs while still meeting color and intensity specifications may be advantageous.

In some embodiments, a common mechanical structure (i.e. common primary optic and filter and common positioning of the LEDs relative to the primary optic) may be used for different target color regions, with only the LED colors and filter colors (and possibly the drive circuitry) changing. For example, a common mechanical structure and common drive circuitry may be used for both the yellow (amber) and blue target color regions. Without promising any particular utility, the ability to use common parts may result in further lowering of costs.

Certain non-limiting examples of apparatus implementing the method 600 will now be described.

Figure 7:
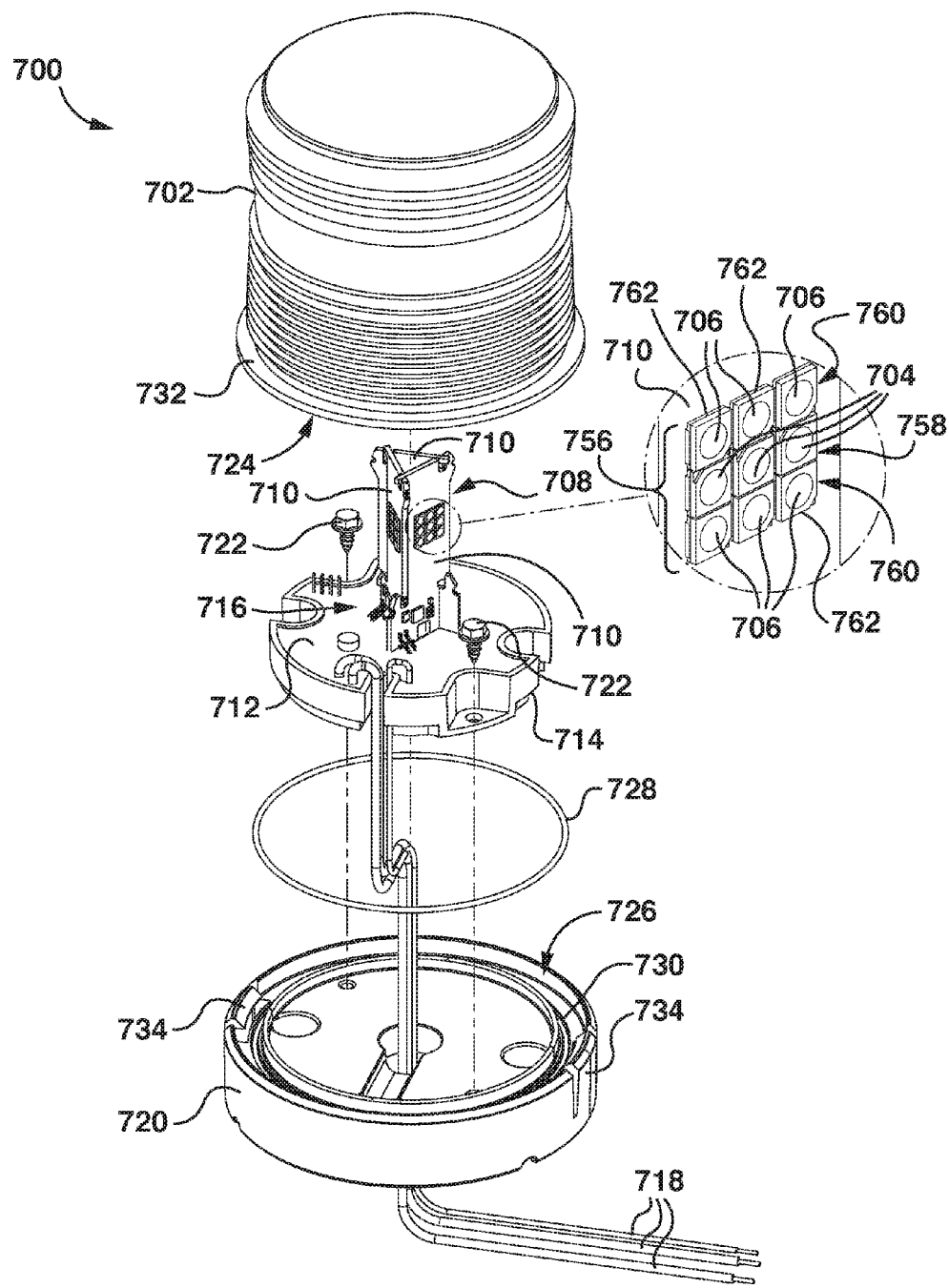
FIG. 7 is an exploded top perspective view of an exemplary beacon light system according to an aspect of the present disclosure.
Figure 8:
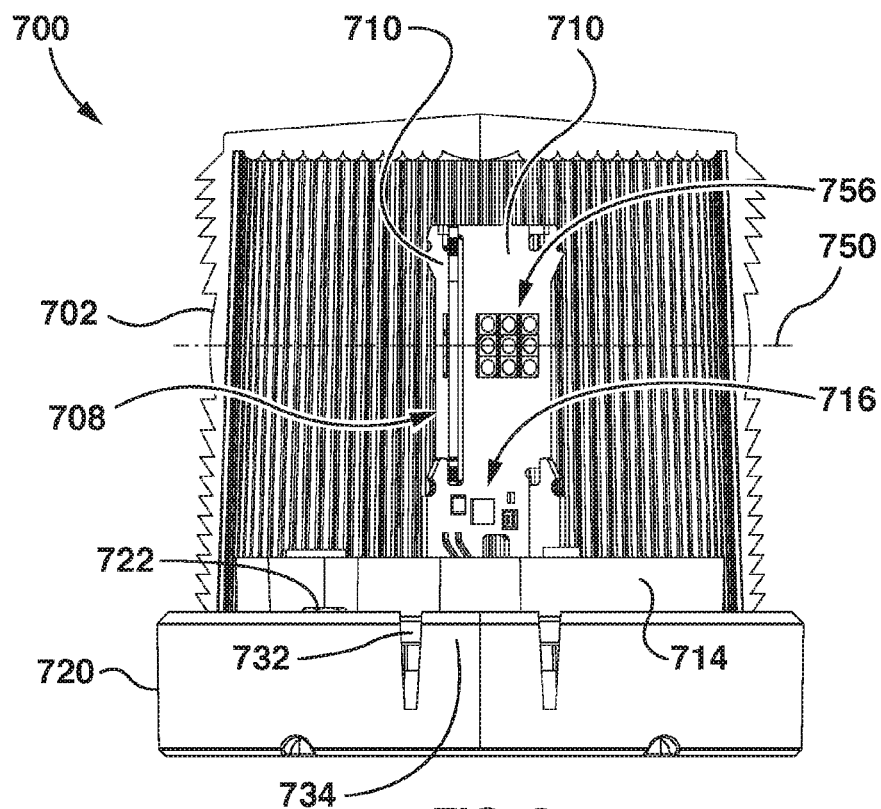
FIG. 8 is a partial cut-away side elevation view of the beacon light system of FIG. 7.
Figure 9:
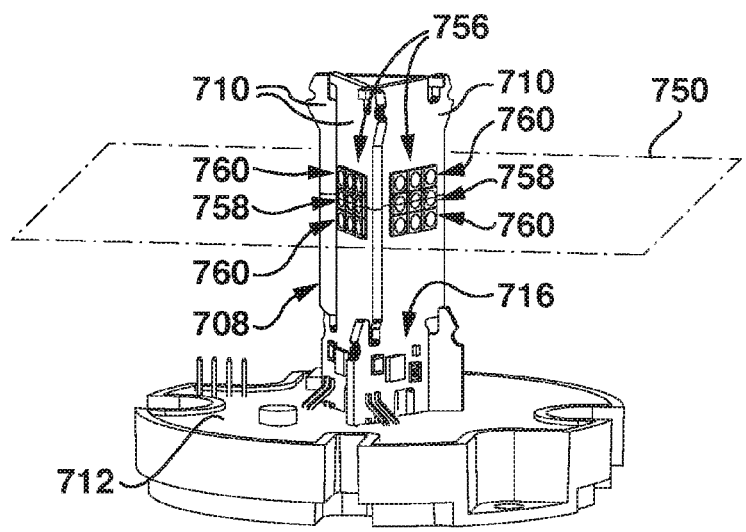
FIG. 9 is a top perspective view of an inner portion of the beacon light system of FIG. 7.

With reference now to FIGS. 7 to 9, a first exemplary light system in the form of a beacon light system is indicated generally at 700. The beacon light system 700 projects light within and limited to a non-white target color region, such as the yellow (amber) target color region 120 (FIG. 1) or the restricted blue target color region 140A (FIG. 1). The beacon light system 700 comprises a hollow, cup-shaped primary optic 702, a plurality of base color LEDs 704 and a plurality of additive LEDs 706. The base color LEDs 704 are configured to emit light within the target color region, and preferably so that all of their light is entirely within the target color region and the additive LEDs 706 are configured to emit light within the white color region, preferably so that all of their light is entirely within the white color region. The CCT of the white light emitted by the additive LEDs 706 is skewed toward the target color region as described above in the context of the exemplary method 600. The primary optic 702 is tinted so as to also function as a filter; the primary optic 702 may be made from, for example, polycarbonate (e.g. 123R-112 clear base with appropriate color additive).

The base LEDs 704 and additive LEDs 706 are carried by an LED support post 708 of generally equilateral triangular shape; the LED support post 708 is formed from three interlocking LED support plates 710 which are secured to an LED carrier 714. The generally equilateral triangular shape of the LED support post 708 cooperates with primary optic 702 to achieve a 360° distribution of light; other suitable polygonal shapes (e.g. square, octagon, etc.) may also be used as appropriate.

In the illustrated embodiment, the LED carrier 714 is a hollow tray which carries a circuit board 716A (FIG. 11) and which is filled with a suitable insulating epoxy 712 which encapsulates the circuit board 716A and serves to fix the LED support plates 710 in position. The LED support plates 710 are preferably formed as metal core circuit boards and can act as a heat sink for the LEDs 704, 706. Circuitry 716 is carried by the LED support plates 710 and the LED carrier 714 (i.e. a portion of the circuitry 716 is on a circuit board 716A (FIG. 11) set into the tray and embedded in the epoxy 712; the circuitry 716 forms a control circuit that is coupled to the LEDs for flashing the LEDs and may be coupled by way of electrical wires 718 to a power source, such as the electrical system of a motor vehicle (not shown). The control circuit may be of conventional design and is not described further as it will be within the capability of one skilled in the art, now informed by the present disclosure.

The LED carrier is secured to an outer base 720 by fasteners 722. The lower edge 724 of the primary optic 702 is received in an annular recess 726 formed in the outer base 720 and sealed thereto by an annular seal 728 that is received in an annular channel 730 in the recess 726. The primary optic 702 is secured to the outer base 720 by interengagement between an outwardly projecting annular flange 732 at the lower end 724 of the primary optic 702 and a pair of diametrically opposed inwardly projecting clips 734 formed integrally with the outer base 720.

In the exemplary beacon light system 700, the primary optic 702 is a confining primary optic in the form of a Fresnel lens which, as shown in FIGS. 8 and 9, has a focus in the form of a focal plane 750.

Referring again to FIGS. 7 to 9, it can be seen that each LED support plate 710 carries nine LEDs arranged in a 3×3 array 756. The center row 758 of the array 756 contains the base LEDs 704, and the two outer rows 760 of the array 756 contain the additive LEDs 706. The LED support post 708 formed by the LED support plates 710 is configured so that the optical centers of the base color LEDs (the center row 758 of the array 756 on each LED support plate 710) are substantially co-incident with the focal plane 750 and therefore the base color LEDs 704 are positioned substantially on the focal plane 750. In contrast, the emitting surfaces of the additive LEDs 706 are spaced from and do not intersect the focal plane 750; therefore the additive LEDs 706 are substantially offset from the focal plane 750. Thus, the base color LEDs 704 have a common vertical configuration about the focal point on which the focal plane 750 is centered. Looking at the columns 762 of the array 756, a pair of additive LEDs 706 is associated with and positioned adjacent to each base LED 704 and, within each pair of additive LEDs 706, one of the additive LEDs is disposed on a first side of the focal plane 750 and the other additive LED 706 is disposed on a second side of the focal plane 750 opposite the first side of the focal plane 750. In the illustrated embodiment, within each pair of additive LEDs 706, each of the additive LEDs 706 has identical photometric output and each additive LED 706 is disposed equidistant from the focal plane.

Figure 10A:
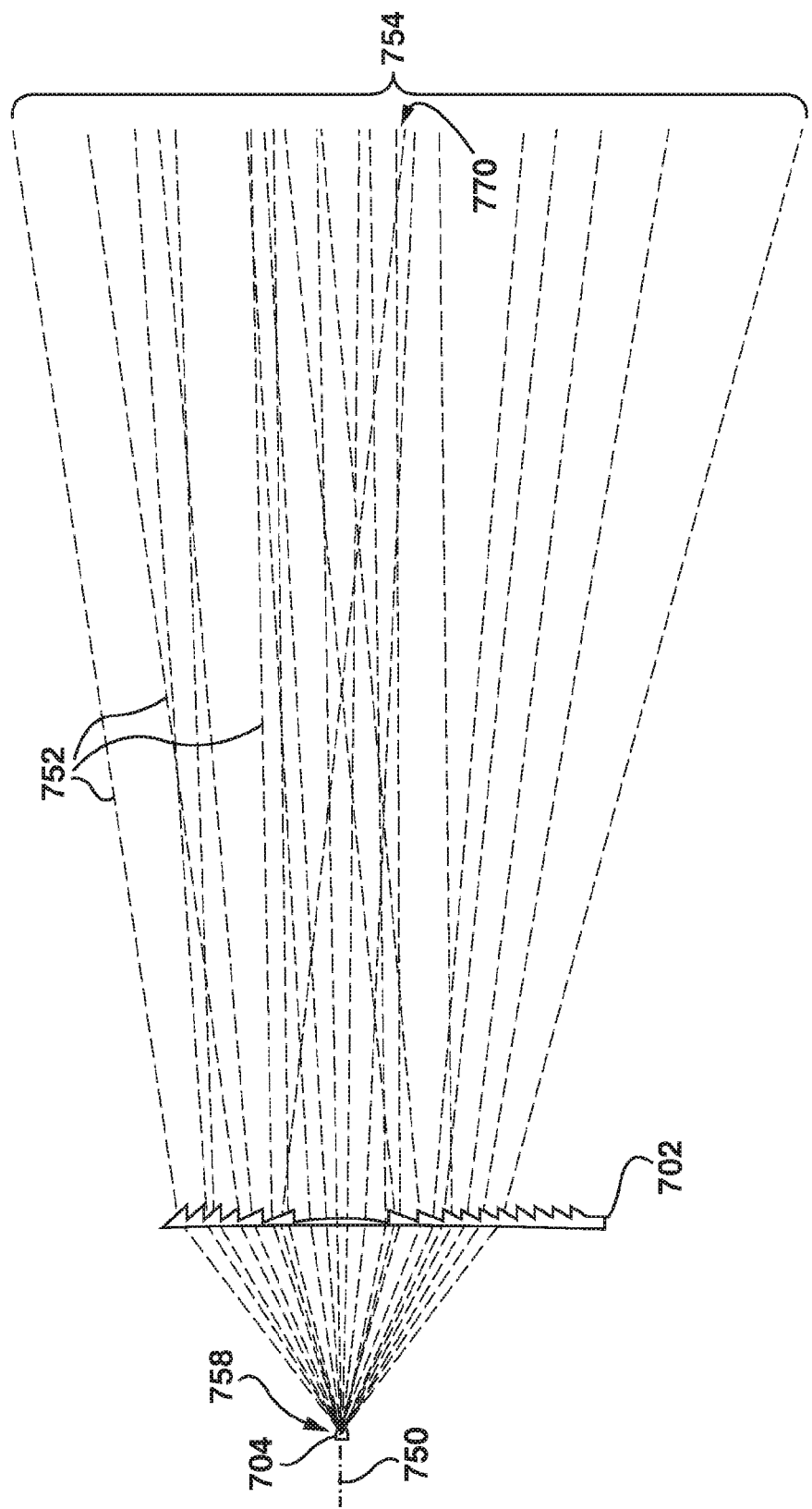
FIGS. 10A to 10D show light patterns produced by LEDs of the beacon light system of FIG. 7 in cooperation with the primary optic thereof.
Figure 10B:
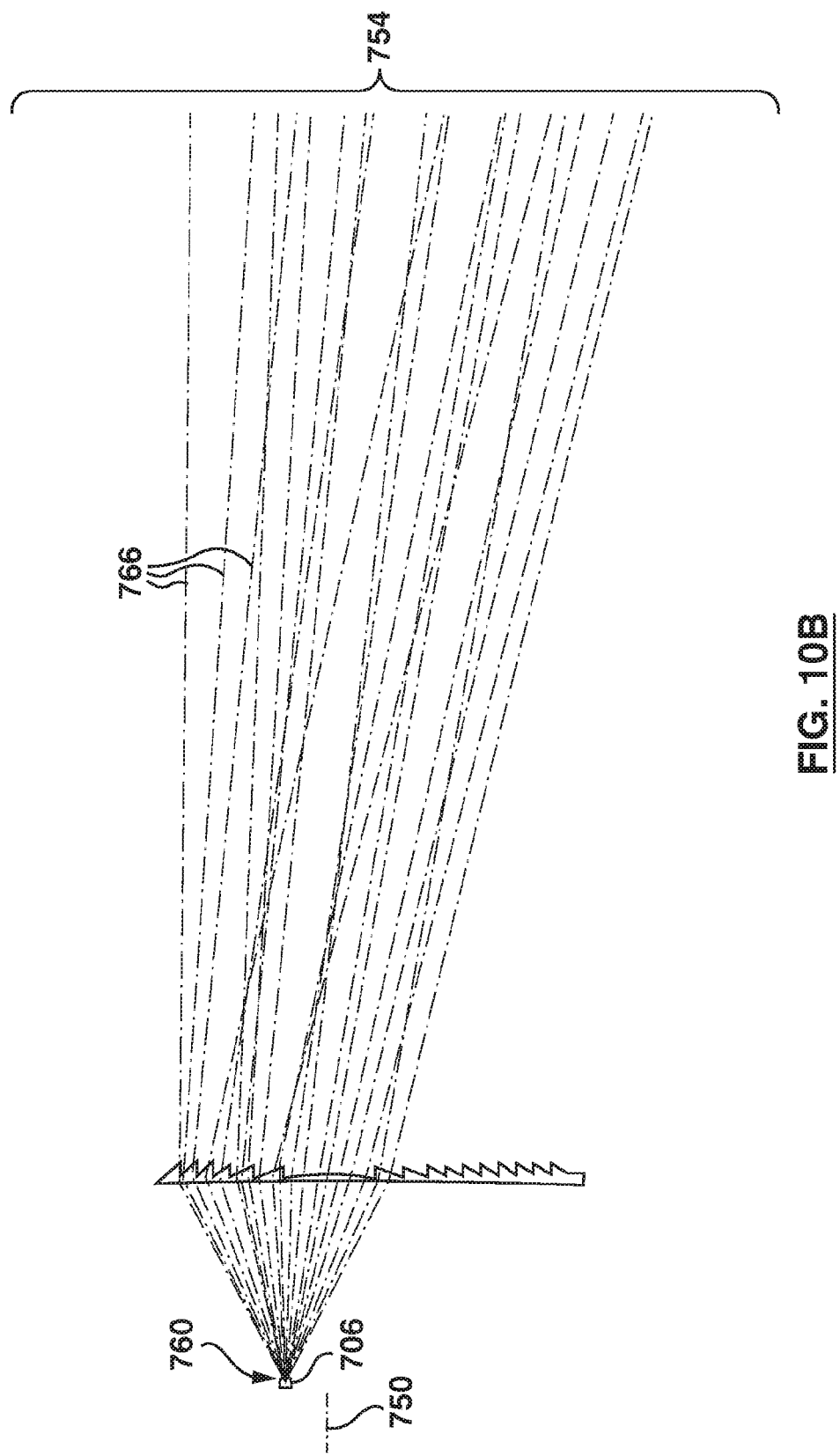
Figure 10C:
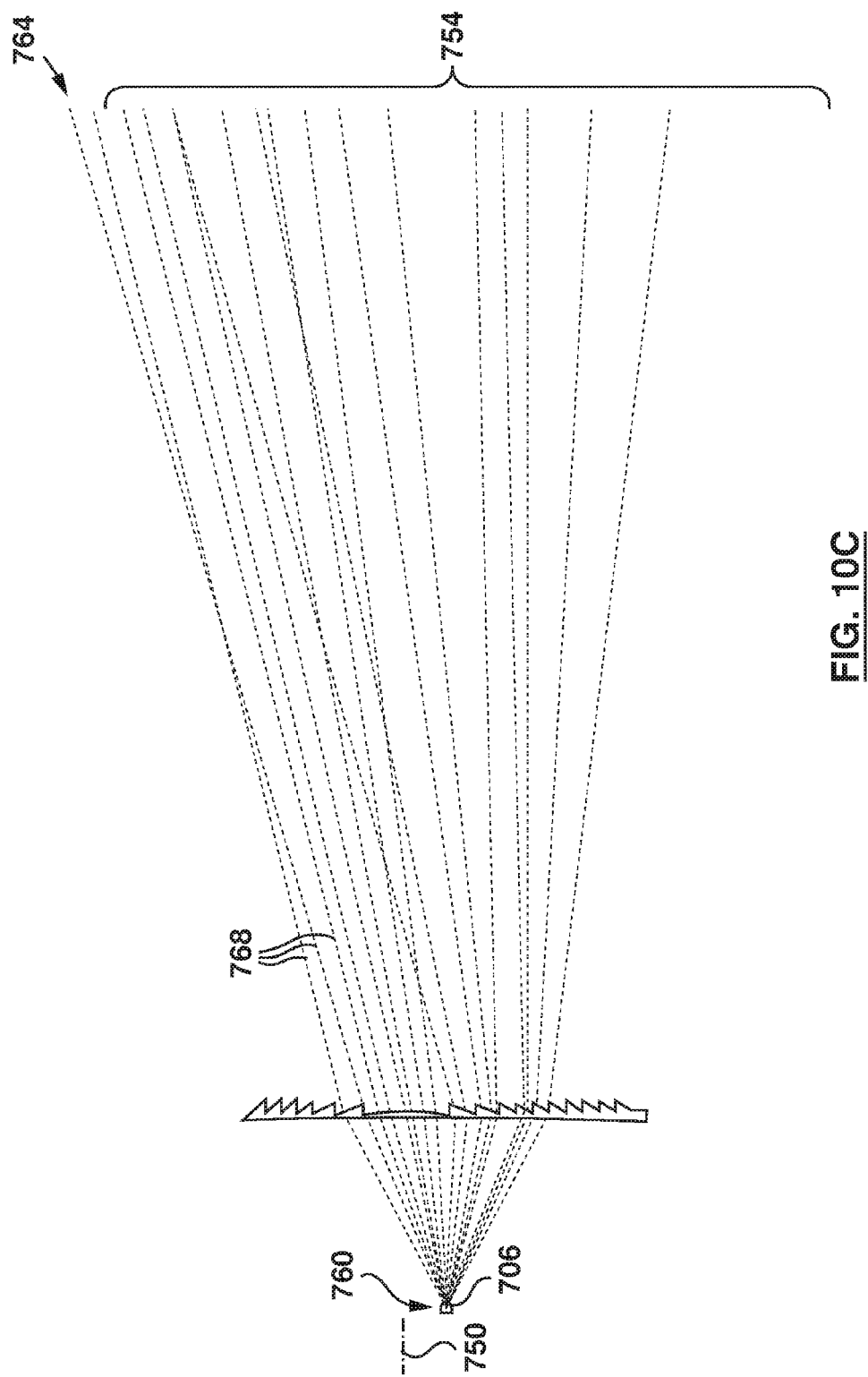
Figure 10D:
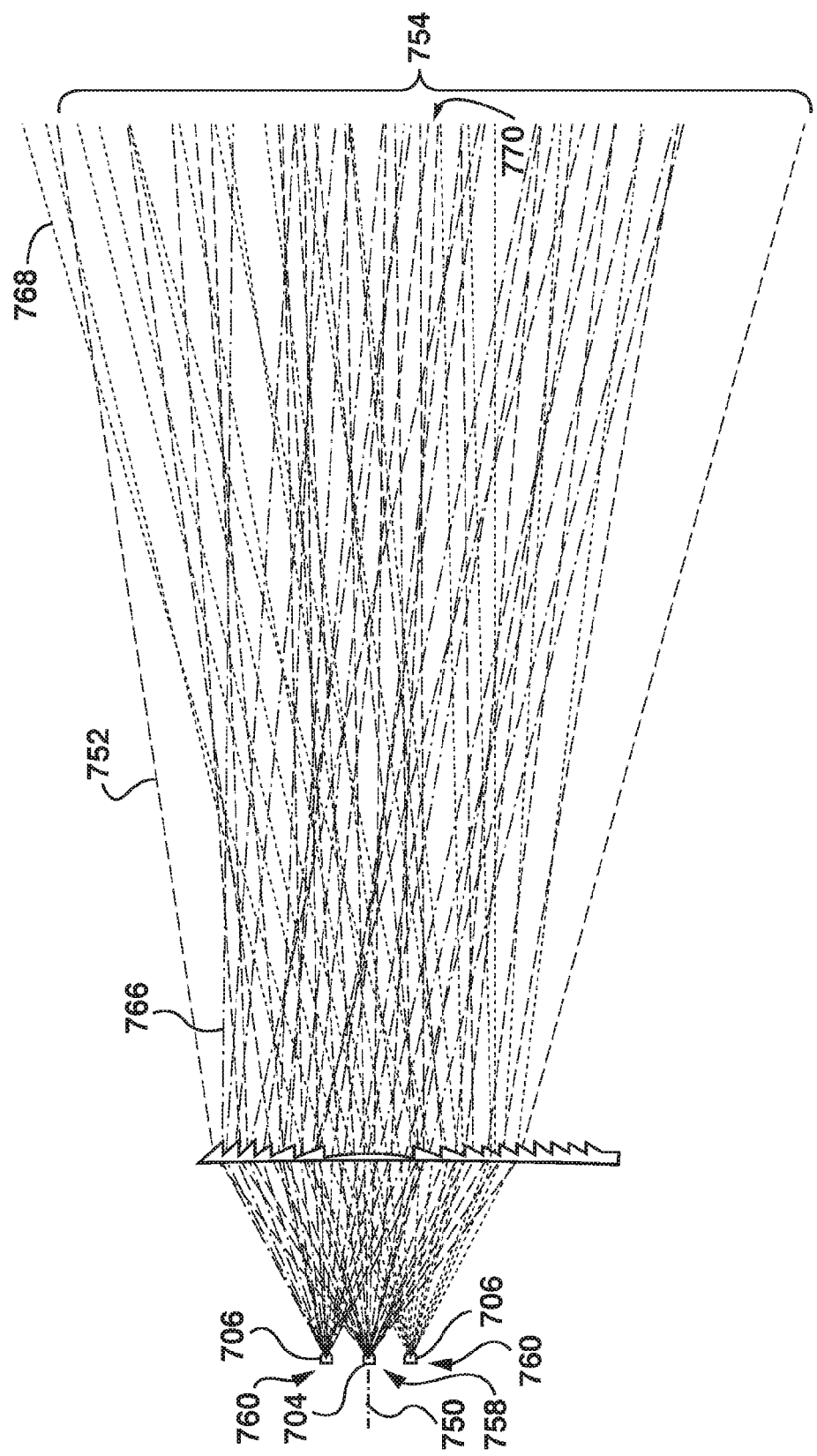

The primary optic 702 is configured to direct light from the focal plane 750 outwardly within a viewing angle range 754. Because the base color LEDs 704 are positioned substantially on the focal plane 750, the colored light emitted by the base color LEDs 704, denoted by dashed lines 752, will be directed outwardly within the viewing angle range 754, as shown in FIG. 10A. In contrast, because the additive LEDs 706 are substantially offset from the focal plane 750, the white light emitted by the additive LEDs 706 does not necessarily extend across the full viewing angle range 754 and may include a portion 764 (FIG. 10C) of light that is directed outside of the viewing angle range 754. FIG. 10B shows the light pattern, denoted by dash-dot-dash lines 766, generated by the primary optic 702 from the additive LEDs 706 in the row 760 that is furthest from the LED carrier 714. FIG. 10C shows the light pattern, denoted by short-dash lines 768, produced by the primary optic 702 from the additive LEDs 706 in the row 760 that is closest to the LED carrier 714. FIG. 10D shows the overall light pattern resulting from the base LEDs 704 and the additive LEDs 706.

As noted above, the primary optic 702 is tinted so as to also function as a filter; hence, the filter is integral with the Fresnel lens that is the primary optic 702. Since the primary optic 702 is interposed between the LEDs 704, 706 and a notional viewer, this means that a filter is interposed between the LEDs 704, 706 and the notional viewer. The filter integrated into the primary optic 702 is configured to suppress light outside of the target color region; i.e. the filter acts as a bandpass filter. As can be seen by reference to FIGS. 10A and 10D, the colored light from the base LEDs 704 is concentrated around the midpoint 770 of the viewing angle range 754 (FIG. 10A) and the overall light pattern is also concentrated around the midpoint 770 of the viewing angle range 754 (FIG. 10D). The result of this light pattern, coupled with the effect of the filter in suppressing light from the additive LEDs 706 that is outside of the target region, is that a dominant portion of the filtered light passing through the filter to the notional viewer at the midpoint 770 of the viewing angle range 754 is within the target color region.

A first amber beacon light system was constructed according to the above design and tested under the J845 standard. The tested beacon light system used Lumileds 3535L PC Amber LEDs as the base color LEDs 704 and used Lumileds 3535L 2700K White LEDs as the additive LEDs 706. These LEDs are available from Lumileds Holding B.V. having an address at 370 W. Trimble Road, San Jose, Calif. 95131 USA. The tested beacon light system had approximately 100 mA per column 762 of LEDs 704, 706 for a total of 300 mA per array 756. The LEDs 704, 706 were arranged so that the LEDs 704, 706 in each column 762 were connected in series and each column 762 was connected in parallel with each other column 762. Since the LED support post 708 is formed from three (3) LED support plates 710 each having three columns 762 of LEDs 704, 706, the total number of columns 762 is nine (9). The primary optic 702 was a Fresnel lens formed from Polycarbonate 123R-112 Clear with a 2% amber tint (3MC04671 Trans.LT Orange) so as to function as a filter. Such a primary optic is available as part 330-A from SWS Warning Systems Inc. having an address at 7695 Blackburn Parkway, Niagara Falls, Ontario, Canada L2H 0A6.

Figure 12:
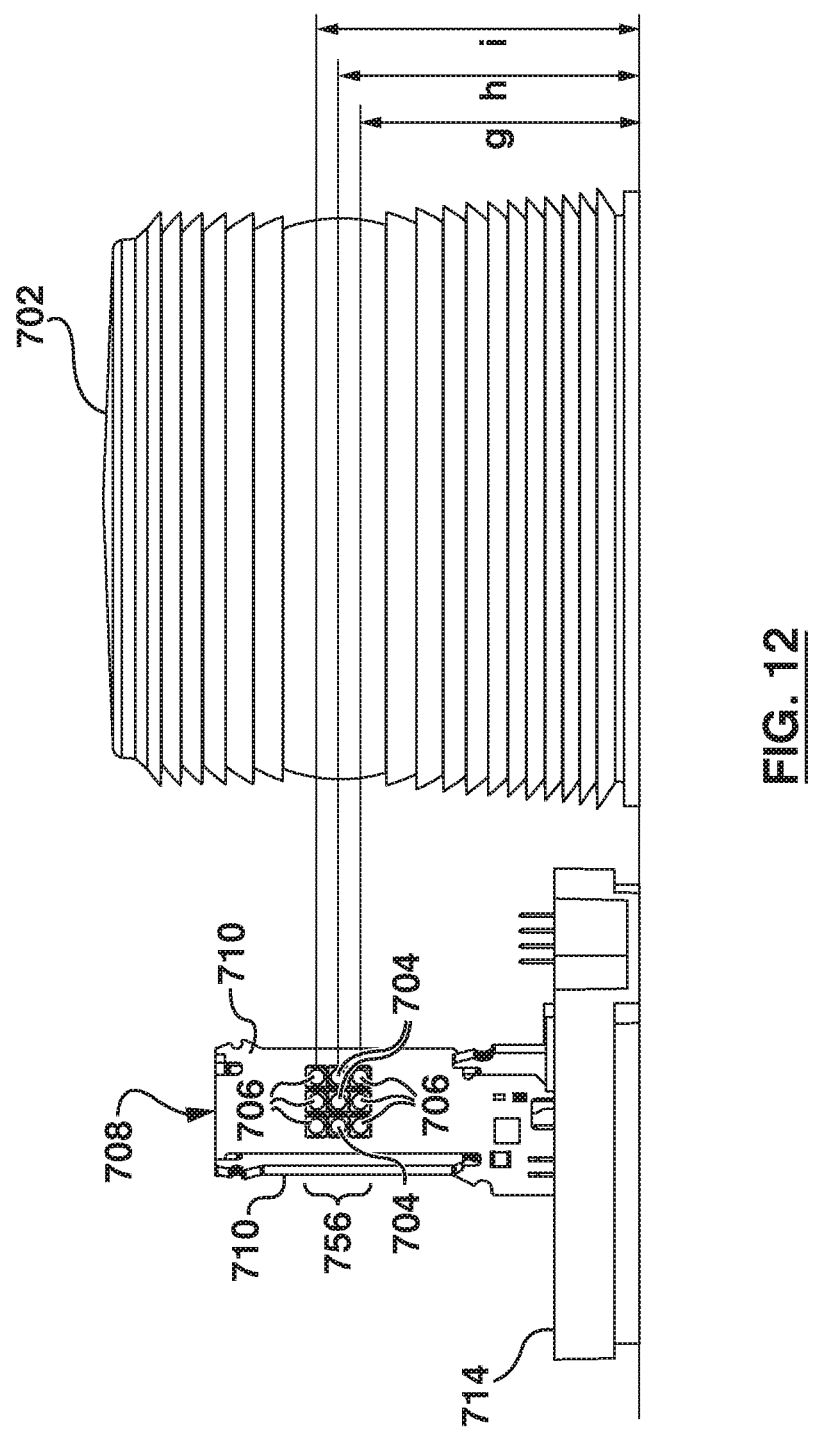
FIG. 12 is a disassembled side elevation view showing positioning of the LEDs of the beacon light system of FIG. 7 relative to the primary optic thereof.

FIGS. 11 and 12 show dimensions and relative spacing for components of the first amber beacon light system 700, where the dimensions represented by the letters "a" through "i" are given in inches (other than "f", which is in degrees) in the table below.

| Dimension | Value |
|---|---|
| a | 0.080 |
| b | 0.080 |
| c | 0.240 |
| d | 0.148 |
| e | 0.212 |
| f | 60° |
| g | 1.816 |
| h | 1.958 |
| i | 2.100 |

This first amber beacon light system passed the J845 Class 1 standard test for color and intensity with the following results:

| Test Point | Measured Intensity (cd) | Minimum Intensity (cd) | Measured Power (cd-sec/min) | Minimum Power (cd-sec/min) |
|---|---|---|---|---|
| 5° Up | 265.1 | 38 | 7128.4 | 900 |
| 2.5° Up | 286.8 | 169 | 7704.4 | 4050 |
| 0° (H-V) | 318.9* | 338 | 8527.2 | 8100 |
| 2.5° Down | 260.7 | 169 | 7042.4 | 4050 |
| 5° Down | 260.1 | 38 | 6993.8 | 900 |

*meets the 60% minimum required

Figure 13:
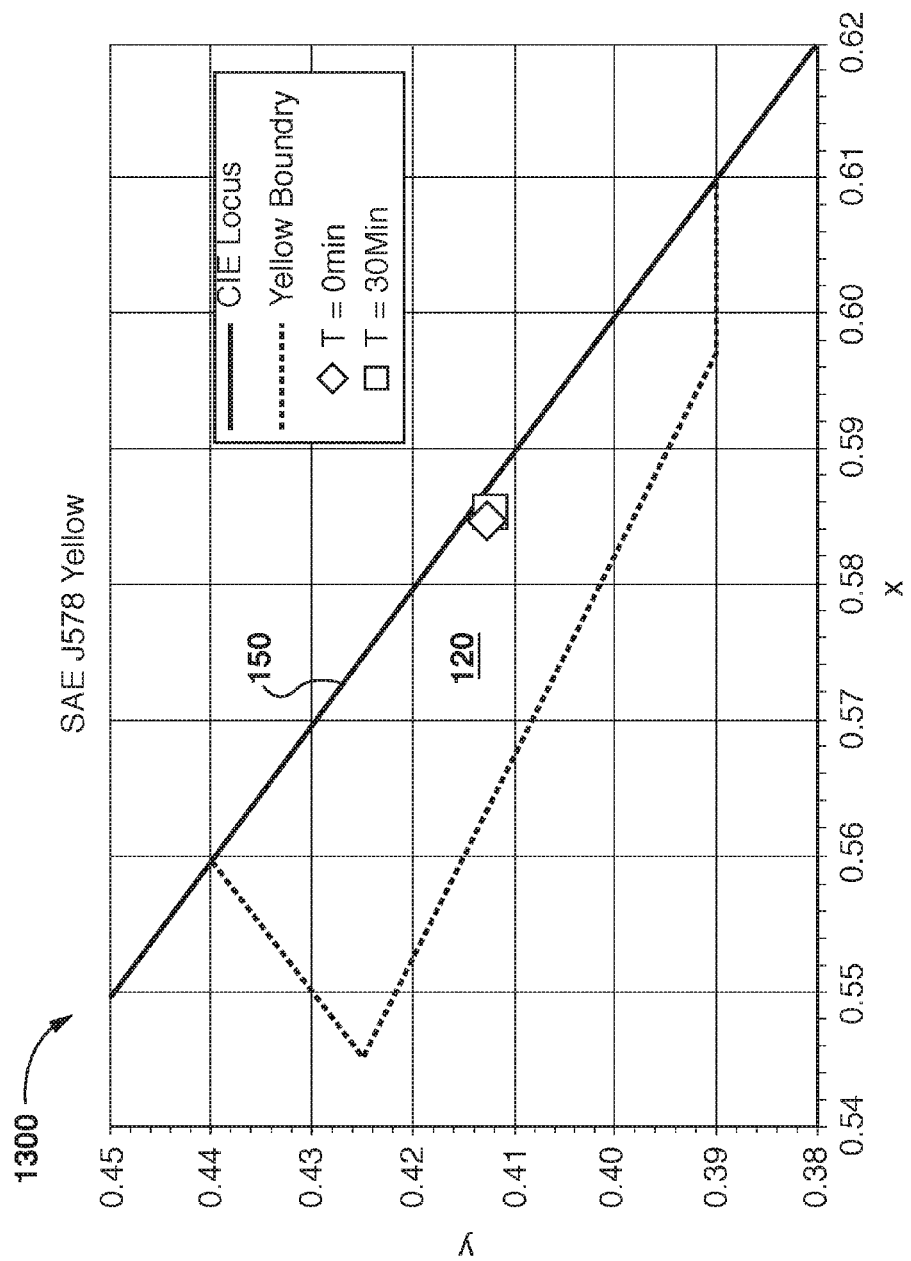
FIG. 13 is a graph showing a portion of the CIE (1931) standard colorimetric system shown in FIG. 1 which includes the yellow (amber) target color region, and showing the position of light produced by a first exemplary amber beacon light system.

FIG. 13 is a graph 1300 showing a portion of the CIE (1931) standard colorimetric system shown in FIG. 1 which includes the yellow (amber) target color region 120, and showing that the light produced by the first amber beacon light system is entirely within the yellow (amber) target color region 120.

A second amber beacon light system was constructed using identical LEDs to those in the first amber beacon light system arranged in 3×3 arrays but on a square LED support post formed by four (4) interlocking LED support plates, for a total of twelve (12) columns of LEDs in which the center rows were base color LEDs and the outer rows were additive LEDs. The LEDs in each column were arranged in series with each column in parallel, for approximately 100 mA per column and a total of 300 mA per array. The primary optic had the same general Fresnel lens shape, although larger to accommodate the larger LED support post, and was formed from Polycarbonate 123R-112 Clear with a 2% amber tint (3MC04671 Trans.LT Orange) so as to function as a filter. Such a primary optic is available as part 300-S-A from SWS Warning Systems Inc. having an address at 7695 Blackburn Parkway, Niagara Falls, Ontario, Canada L2H 0A6. This second amber beacon light system passed the J845 Class 1 standard test for both color and intensity with the following results:

| Test Point | Measured Intensity (cd) | Minimum Intensity (cd) | Measured Power (cd-sec/min) | Minimum Power (cd-sec/min) |
| --- | --- | --- | --- | --- |
| 5° Up | 374 | 38 | 8773 | 900 |
| 2.5° Up | 319 | 169 | 7468 | 4050 |
| 0° (H-V) | 562 | 338 | 13198 | 8100 |
| 2.5° Down | 351 | 169 | 8287 | 4050 |
| 5° Down | 414 | 38 | 9693 | 900 |

Figure 14:
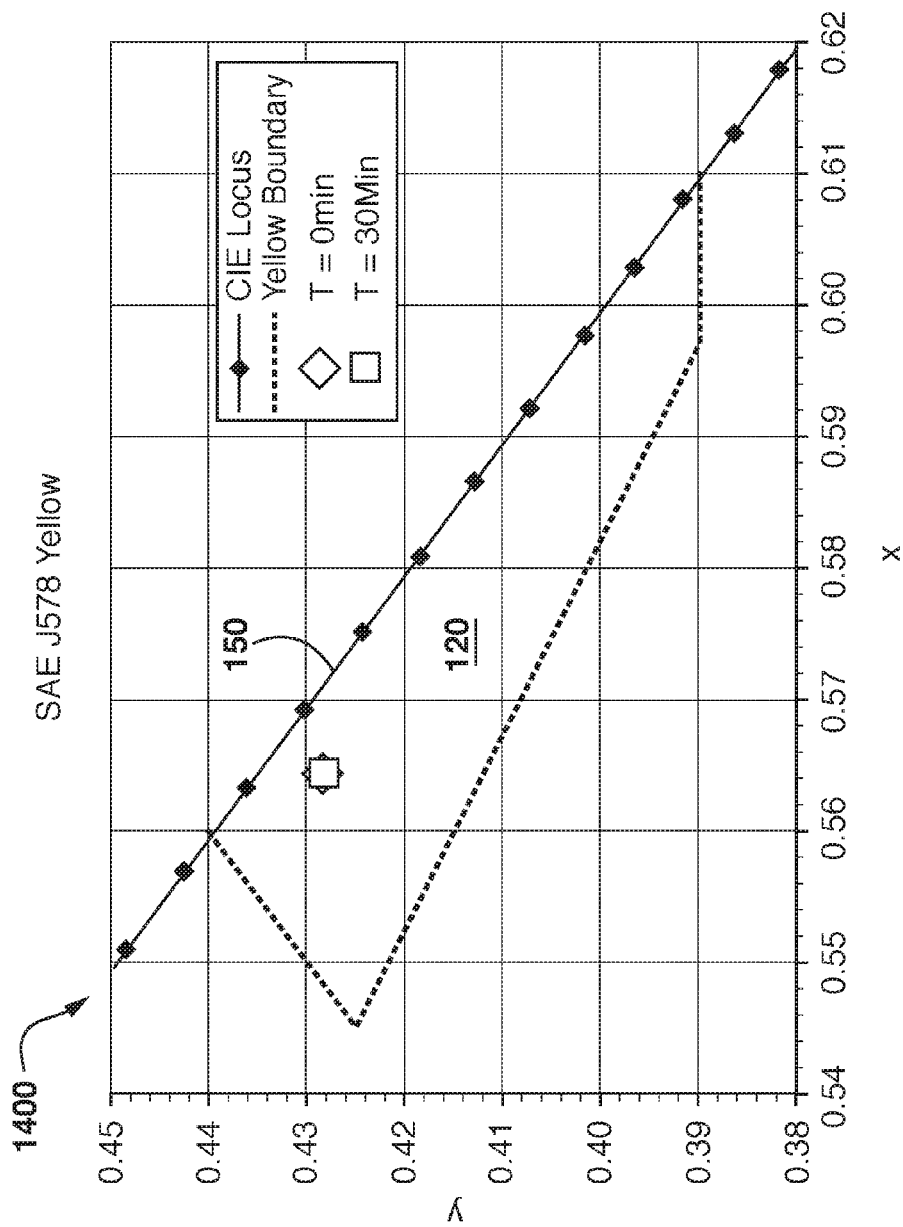
FIG. 14 is a graph showing a portion of the CIE (1931) standard colorimetric system shown in FIG. 1 which includes the yellow (amber) target color region, and showing the position of light produced by a second exemplary amber beacon light system.

FIG. 14 is a graph 1400 showing a portion of the CIE (1931) standard colorimetric system shown in FIG. 1 which includes the yellow (amber) target color region 120, and showing that the light produced by the second amber beacon light system is entirely within the yellow (amber) target color region 120.

A first blue beacon light system was constructed identically to the first amber beacon light system, except that the LEDs used were Lumileds 3535L Blue LEDs for the base color LEDs 704 and Lumileds 3535L 6500K White LED for the additive LEDs, and the primary optic 702 was a Fresnel lens formed from Polycarbonate 123R-112 Clear with a 2% blue tint (5MC04883 Transparent Blue) so as to function as a filter. The LEDs are available from Lumileds Holding B.V. having an address at 370 W. Trimble Road, San Jose, Calif. 95131 USA and the primary optic is available as part 330-B from SWS Warning Systems Inc. having an address at 7695 Blackburn Parkway, Niagara Falls, Ontario, Canada L2H 0A6. This first blue beacon light system passed the J845 Class 2 standard test for color and intensity with the following results:

| Test Point | Measured Intensity (cd) | Minimum Intensity (cd) | Measured Power (cd-sec/min) | Minimum Power (cd-sec/min) |
| --- | --- | --- | --- | --- |
| 5° Up | 85.68 | 4 | 2599.3 | 450 |
| 2.5° Up | 95.88 | 23 | 2922.8 | 2050 |
| 0° (H-V) | 99.20 | 41 | 3060.8* | 4050 |
| 2.5° Down | 85.83 | 23 | 2578.9 | 2050 |
| 5° Down | 73.14 | 4 | 2237.3 | 450 |

*meets the 60% minimum required

Figure 15:
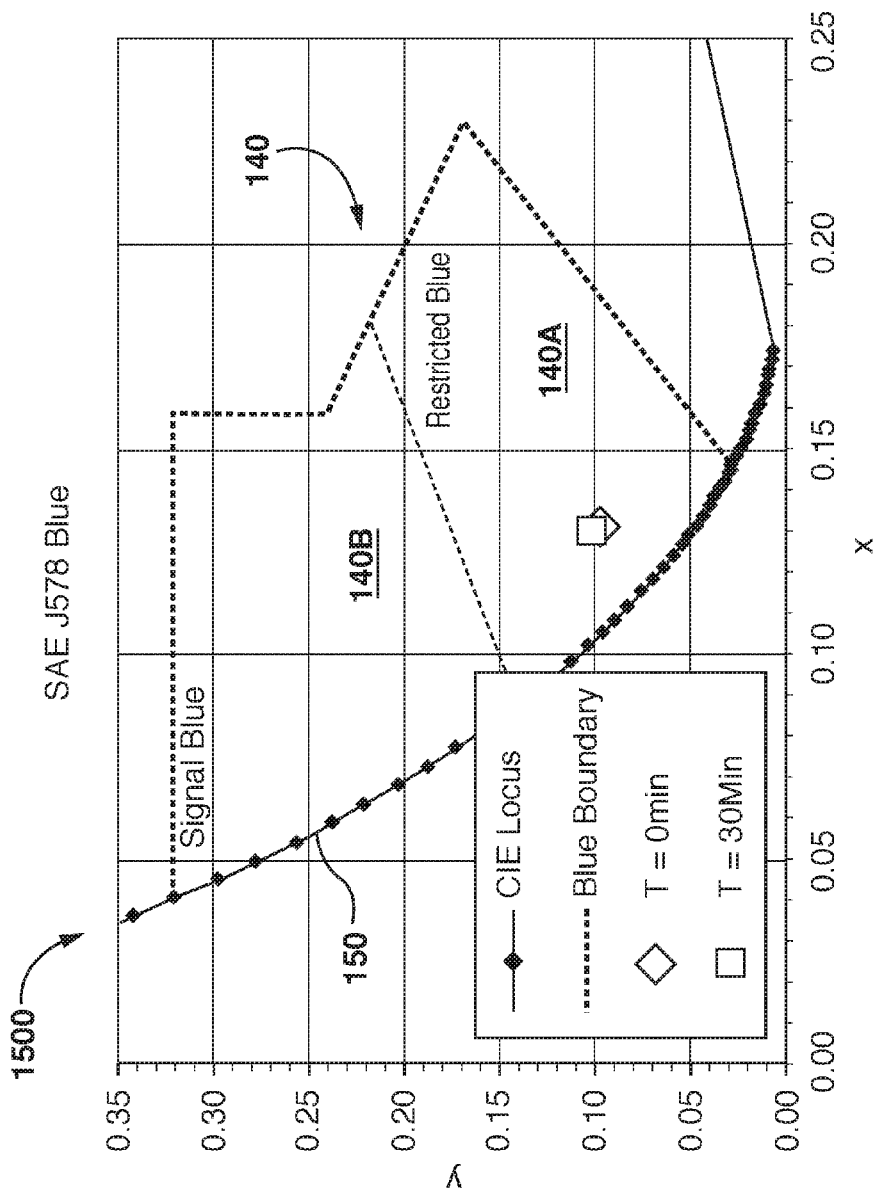
FIG. 15 is a graph showing a portion of the CIE (1931) standard colorimetric system shown in FIG. 1 which includes the blue target color region, and showing the position of light produced by a first exemplary blue beacon light system.

FIG. 15 is a graph 1500 showing a portion of the CIE (1931) standard colorimetric system shown in FIG. 1 which includes the blue target color region 140, and showing that the light produced by the first blue beacon light system is entirely within the restricted blue target color region 140A.

A second blue beacon light system was constructed identically to the second amber beacon light system, except that the LEDs used were Lumileds 3535L Blue LEDs for the base color LEDs 704 and Lumileds 3535L 6500K White LED for the additive LEDs, and the primary optic 702 was a Fresnel lens formed from Polycarbonate 123R-112 Clear with a 2% blue tint (5MC04883 Transparent Blue) so as to function as a filter. The LEDs are available from Lumileds Holding B.V. having an address at 370 W. Trimble Road, San Jose, Calif. 95131 USA and the primary optic is available as part 300-S-B from SWS Warning Systems Inc. having an address at 7695 Blackburn Parkway, Niagara Falls, Ontario, Canada L2H 0A6. This second blue beacon light system passed the J845 Class 1 standard test for color and intensity with the following results:

| Test Point | Measured Intensity (cd) | Minimum Intensity (cd) | Measured Power (cd-sec/min) | Minimum Power (cd-sec/min) |
| --- | --- | --- | --- | --- |
| 5° Up | 104 | 19 | 2457 | 450 |
| 2.5° Up | 103 | 84 | 2446 | 2050 |
| 0° (H-V) | 128* | 169 | 3023* | 4050 |
| 2.5° Down | 68* | 84 | 1624* | 2050 |
| 5° Down | 53 | 19 | 1263 | 450 |

*meets the 60% minimum required

Figure 16:
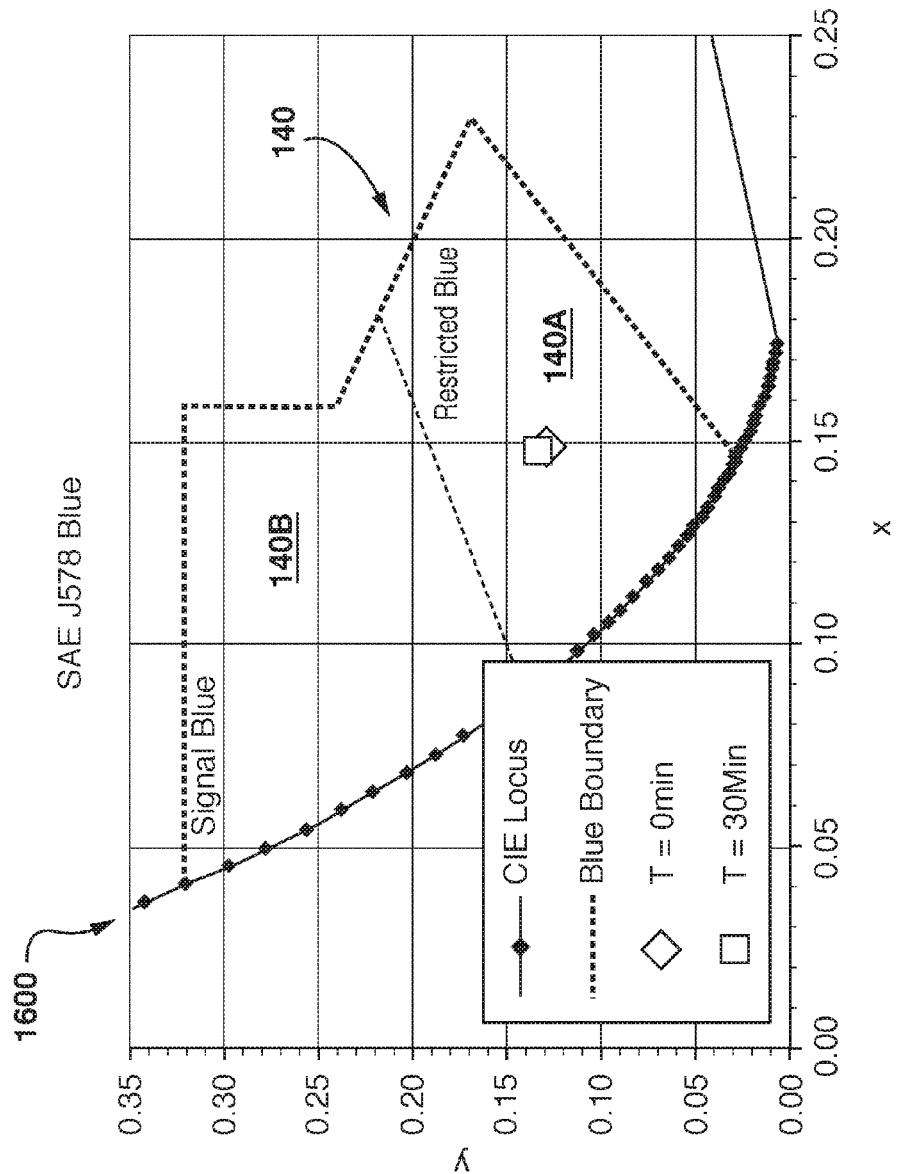
FIG. 16 is a graph showing a portion of the CIE (1931) standard colorimetric system shown in FIG. 1 which includes the blue target color region, and showing the position of light produced by a second exemplary blue beacon light system.
Figure 17:
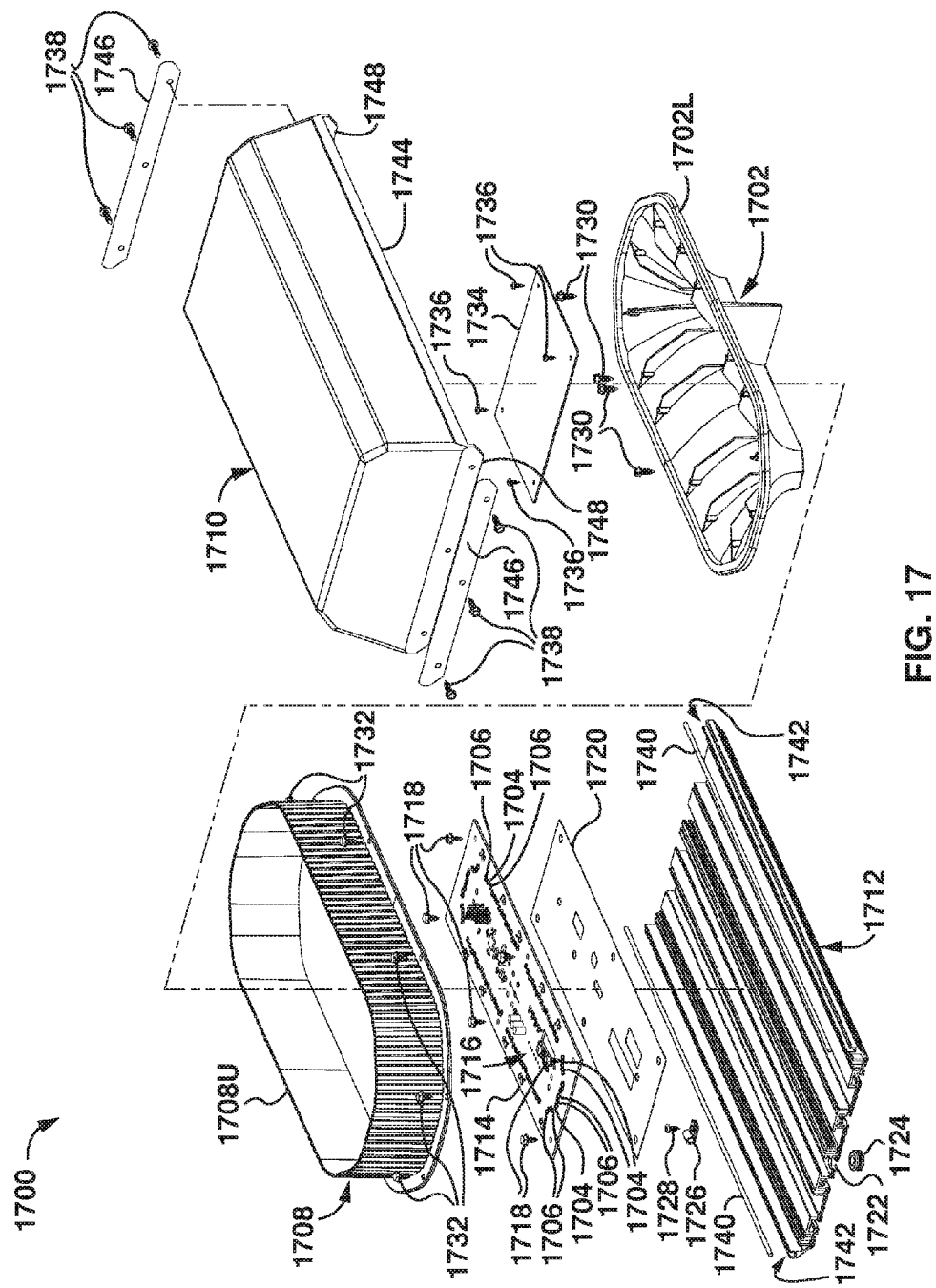
FIG. 17 is an exploded top perspective view of an exemplary minibar light system according to an aspect of the present disclosure.
Figure 18:
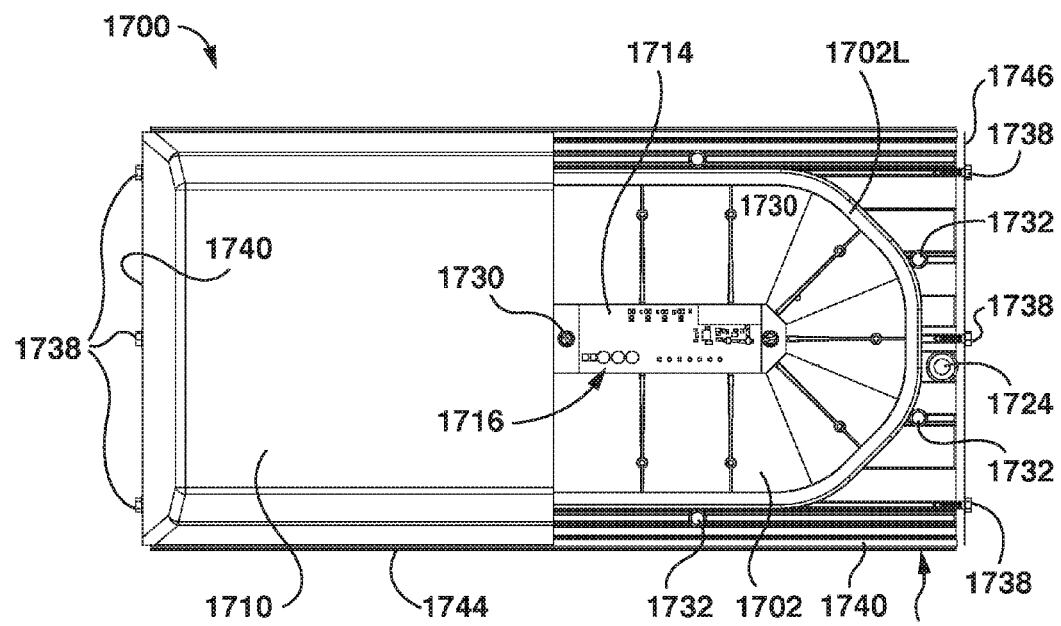
FIG. 18 is a partial cut-away top plan view of the minibar light system of FIG. 17.
Figure 19:
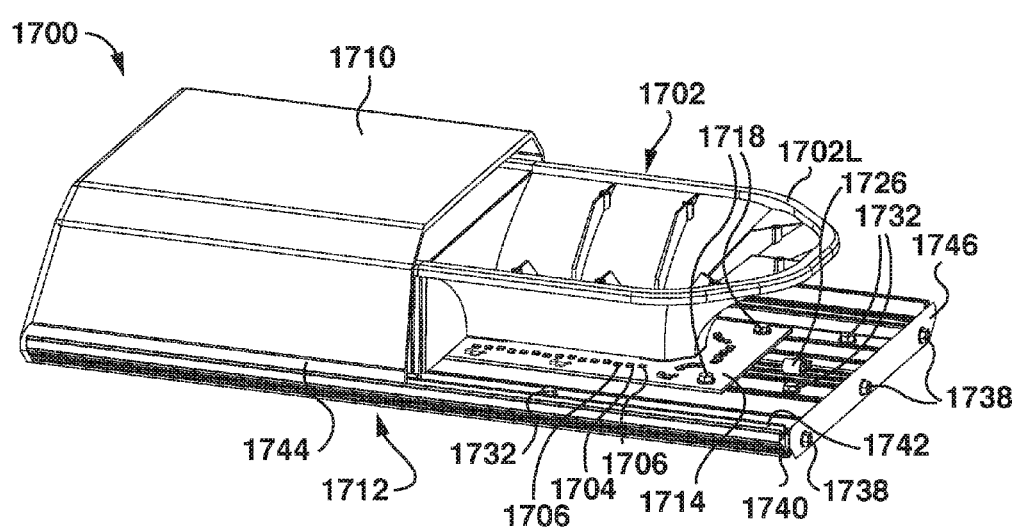
FIG. 19 is a partial cut-away top perspective view of the minibar light system of FIG. 17.
Figure 20:
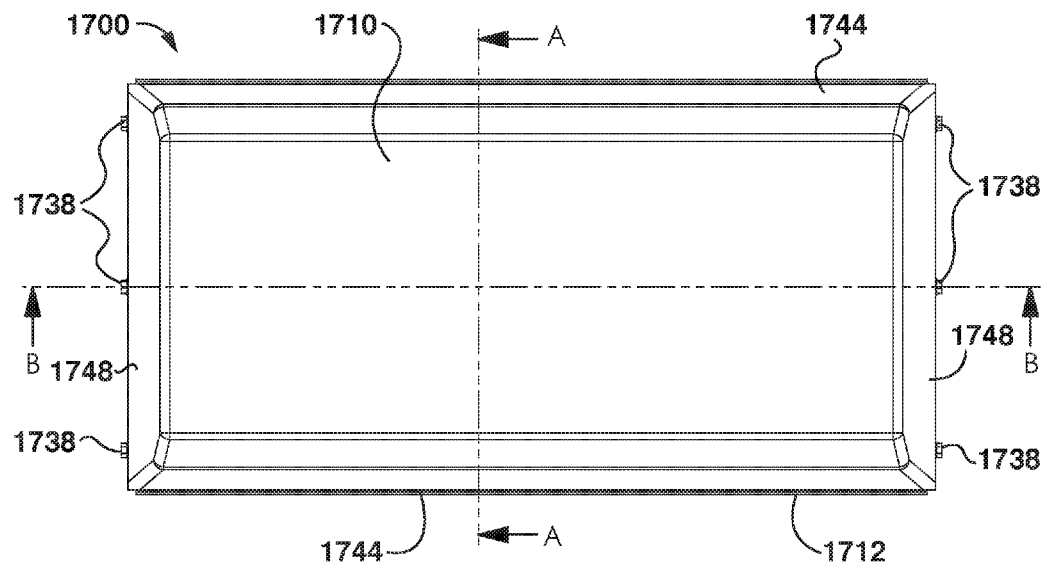
FIG. 20 is a top plan view of the minibar light system of FIG. 17.
Figure 21:
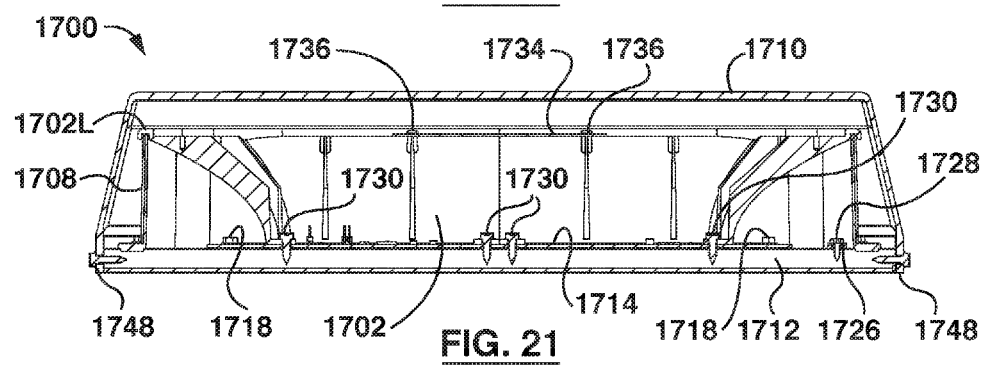
FIG. 21 is a cross-sectional view taken along the line B-B in FIG. 20.
Figure 22:
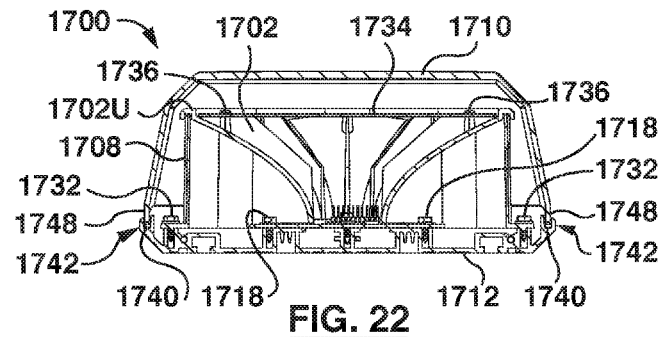
FIG. 22 is a cross-sectional view taken along the line A-A in FIG. 20.

FIG. 16 is a graph 1600 showing a portion of the CIE (1931) standard colorimetric system shown in FIG. 1 which includes the blue target color region 140, and showing that the light produced by the second blue beacon light system is entirely within the restricted blue target color region 140A.

Reference is now made to FIGS. 17 to 22, in which a second exemplary light system in the form of an exemplary minibar light system is indicated generally at 1700. The minibar light system 1700 projects light within and limited to a non-white target color region, such as the yellow (amber) target color region 120 (FIG. 1) or the restricted blue target color region 140A (FIG. 1). The minibar light system 1700 comprises a confining primary optic in the form of a concave reflector 1702, a plurality of base color LEDs 1704, a plurality of additive LEDs 1706, a secondary optic in the form of a so-called "pillow lens" 1708 and an outer enclosure 1710. Either or both of the pillow lens 1708 and/or the outer enclosure 1710 may be tinted to act as a filter. The base color LEDs 1704 are configured to emit light within the target color region, and preferably entirely within the target color region and the additive LEDs 1706 are configured to emit light within the white color region, preferably entirely within the white color region. The CCT of the white light emitted by the additive LEDs 1706 is skewed toward the target color region as described above in the context of the exemplary method 600.

The minibar light system 1700 includes a base extrusion 1712 which serves as a base for the minibar light system assembly and also functions as a heat sink; the base extrusion 1712 may be formed from a suitable metal, such as aluminum. A printed circuit board 1714 carrying a control circuit 1716 is secured to the base extrusion 1712 by fasteners 1718; an electrically insulating thermal fabric 1720 is interposed between the printed circuit board 1714 and the base extrusion 1712 to facilitate heat transfer from the printed circuit board 1714 to the base extrusion 1712. The printed circuit board 1714 also carries the base color LEDs 1704 and the additive LEDs 1706 and the control circuit 1716 is coupled to the LEDs 1704, 1706 for flashing the LEDs 1704, 1706. The control circuit 1716 may be of conventional design and is not described further as it will be within the capability of one skilled in the art, now informed by the present disclosure. The base extrusion 1712 includes a notch 1722 at one end thereof to accommodate an electrical power cord (not shown) for connecting the control circuit 1716 to a source of electrical power, such as the electrical system of a vehicle. A grommet 1724 is fitted into the notch 1722, and a strain relief element 1726 is secured to the superior face of the base extrusion 1712 by a fastener 1728 to receive the electrical cord (not shown).

The reflector 1702 is secured in position by fasteners 1730 that pass through apertures in the reflector 1702, printed circuit board 1714 and thermal fabric 1720 into the base extrusion 1712 so that the reflector 1702 is securely carried by the base extrusion 1712. The pillow lens 1708 is directly secured to the base extrusion 1712 by fasteners 1732 and its upper edge 1708U is received in a corresponding inferiorly depending groove in the superior outer lip 1702L of the reflector 1702. Thus, the LEDs 1704, 1706 will be disposed in the space between the reflector 1702 and the pillow lens 1708. A brace plate 1734 extends across the open superior end of the reflector 1702 and is secured thereto by fasteners 1736. The outer enclosure 1710 is secured to the base extrusion 1712 by fasteners 1738 with elongate seals 1740 fitted into channels 1742 in the base extrusion 1712 that receive the long edges 1744 of the reflector 1702. Optionally, labels 1746 may be secured at the short edges 1748 of the outer enclosure 1710.

Figure 23:
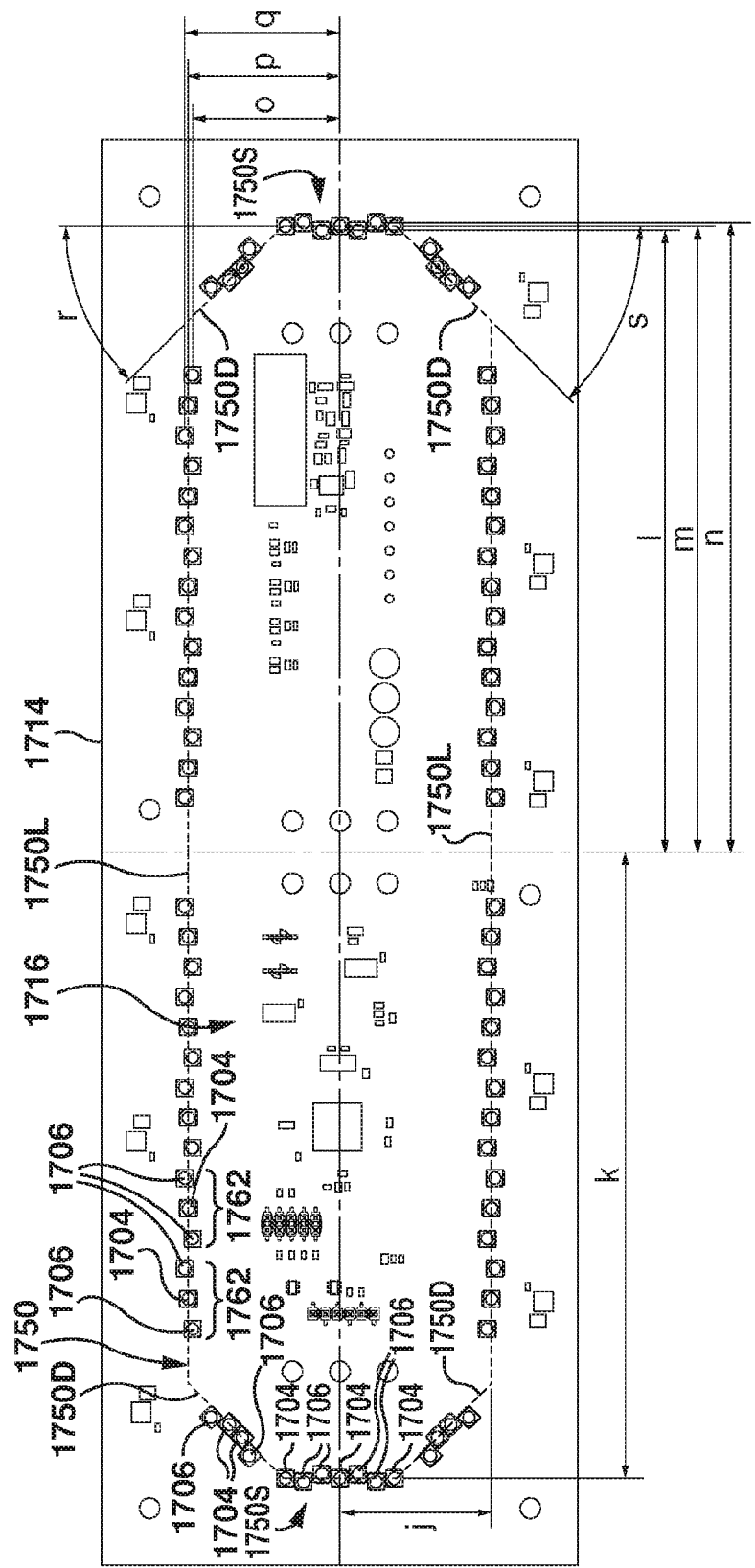
FIG. 23 is a top plan view of a circuit board of the minibar light system of FIG. 17.
Figure 24A:
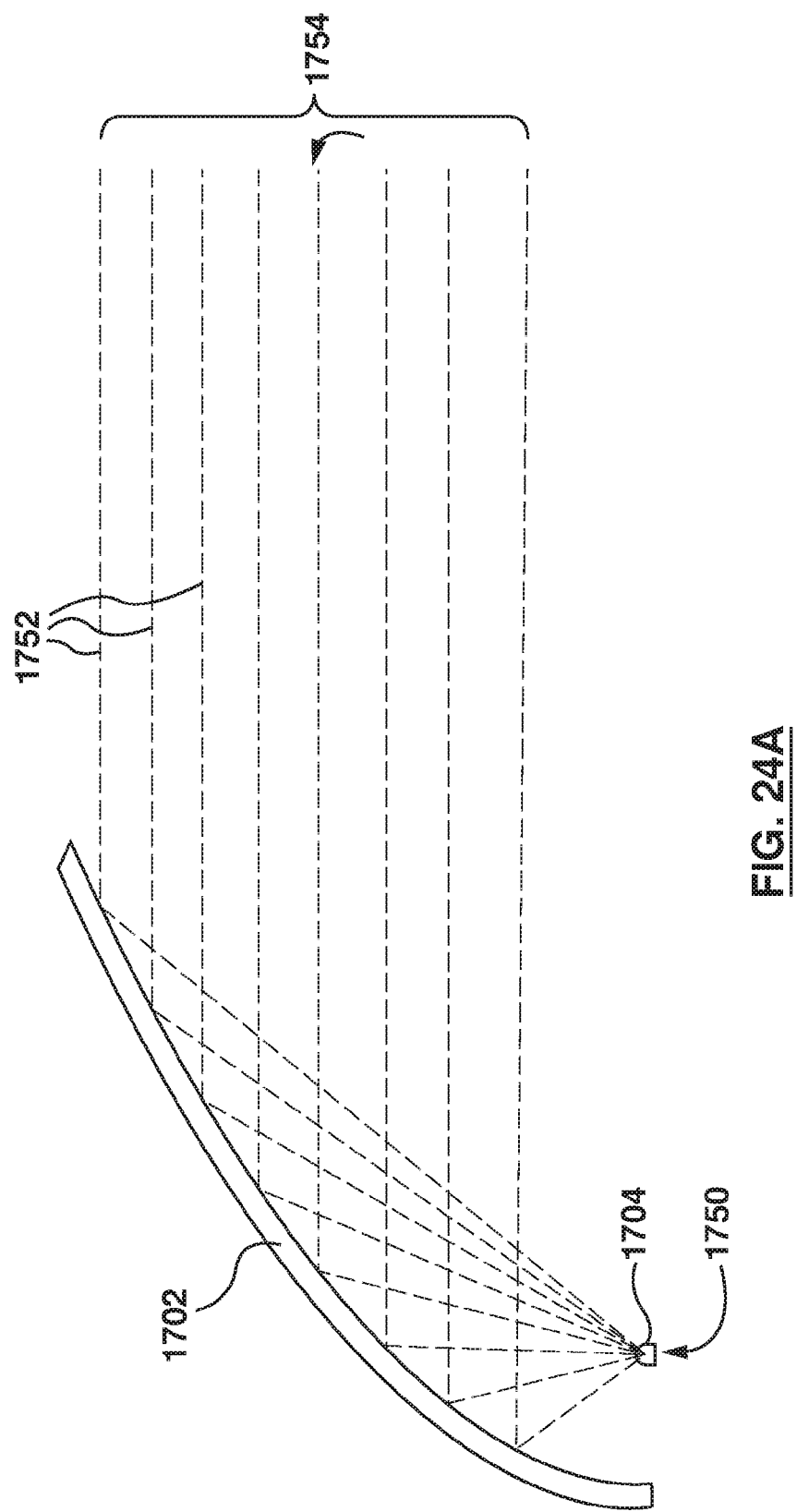
FIGS. 24A to 24D show light patterns produced by LEDs of the minibar light system of FIG. 17 in cooperation with the primary optic thereof.

Reference is now made to FIG. 24A. The reflector 1702 has a focus 1750 and is configured to direct light from the focus 1750 outwardly within a viewing angle range 1754, as shown by the dashed lines 1752. When the reflector 1702 and the printed circuit board 1714 are both secured in position, the elongated generally octagonal shape of the reflector 1702 results in the focus 1750 taking the form of a series of focal line segments tracing the outline of an elongated octagon, as can be seen in FIG. 23. More particularly, the focus 1750 comprises two opposed long edge focal line segments 1750L, two opposed short edge focal line segments 1750S that are substantially perpendicular to the long edge focal line segments 1750L, and four diagonal focal line segments 1750D that connect adjacent long edge focal line segments 1750L and short edge focal line segments 1750S at 45 degree angles. As will be explained in further detail below, each of the focal line segments 1750L, 1750S and 1750D has at least one base color LED 1704 positioned substantially thereon and at least one additive LED 1706 substantially offset therefrom.

In the J845 standard for a minibar light system, the color of the light is measured along the longer edge, i.e. along one of the long edge focal line segments 1750L, as this is the standard operating orientation (e.g. motorists approaching a minibar-equipped vehicle that has pulled over to the side of the road with the lights active will see the longer edge) while the intensity is measured at the point of lowest optical intensity.

With respect to the long edge focal line segments 1750L, the LEDs 1704, 1706 are arranged in groups 1762 of three LEDs 1704, 1706 consisting of one pair of additive LEDs 1706 associated with and positioned adjacent to a respective base color LED 1704 on either side thereof. One of the additive LEDs 1706 in the pair is positioned with its optical center on a first side of the long edge focal line segment 1750L, outwardly relative to the printed circuit board 1714, and the other additive LED 1706 in the pair is positioned with its optical center on a second side of the long edge focal line segment 1750L opposite the first side, inwardly relative to the printed circuit board 1714. This produces a staggered formation that is repeated along the long edge focal line segments 1750L. In a preferred embodiment, each of the additive LEDS 1706 in the pair has identical photometric output and the optical center of each additive LED 1706 in the pair is disposed equidistant from the long edge focal line segments 1750L. Although the long edge focal line segments 1750L intersect the emitting surfaces of the additive LEDs 1706, the optical centers of the additive LEDs 1706 are further from the respective long edge focal line segment 1750L than fifty percent (50%) of the diameter of the emitting surfaces of the additive LEDs 1706 and therefore the additive LEDs 1706 are substantially offset from the long edge focal line segments 1750L.

Figure 24B:
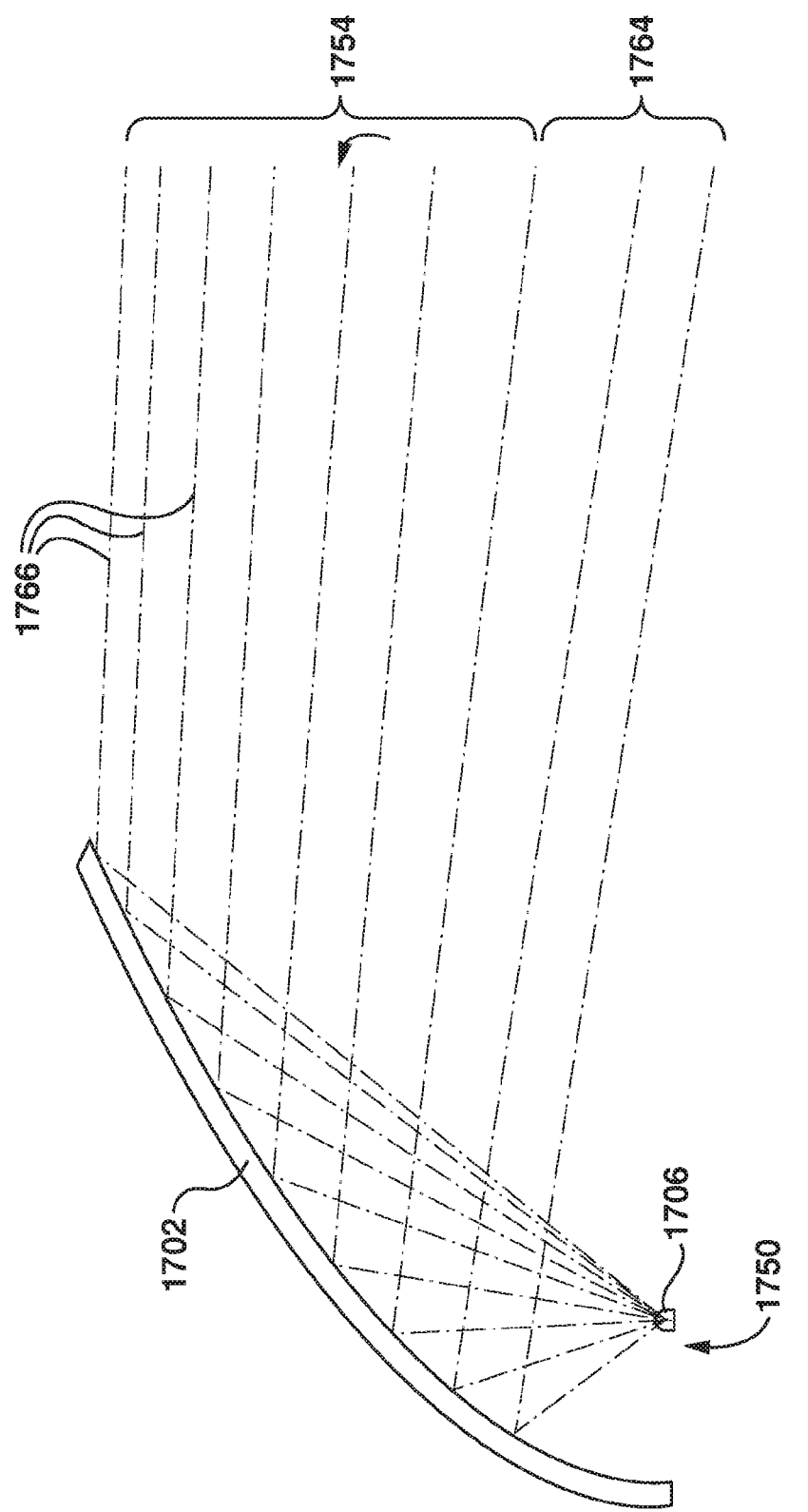
Figure 24C:
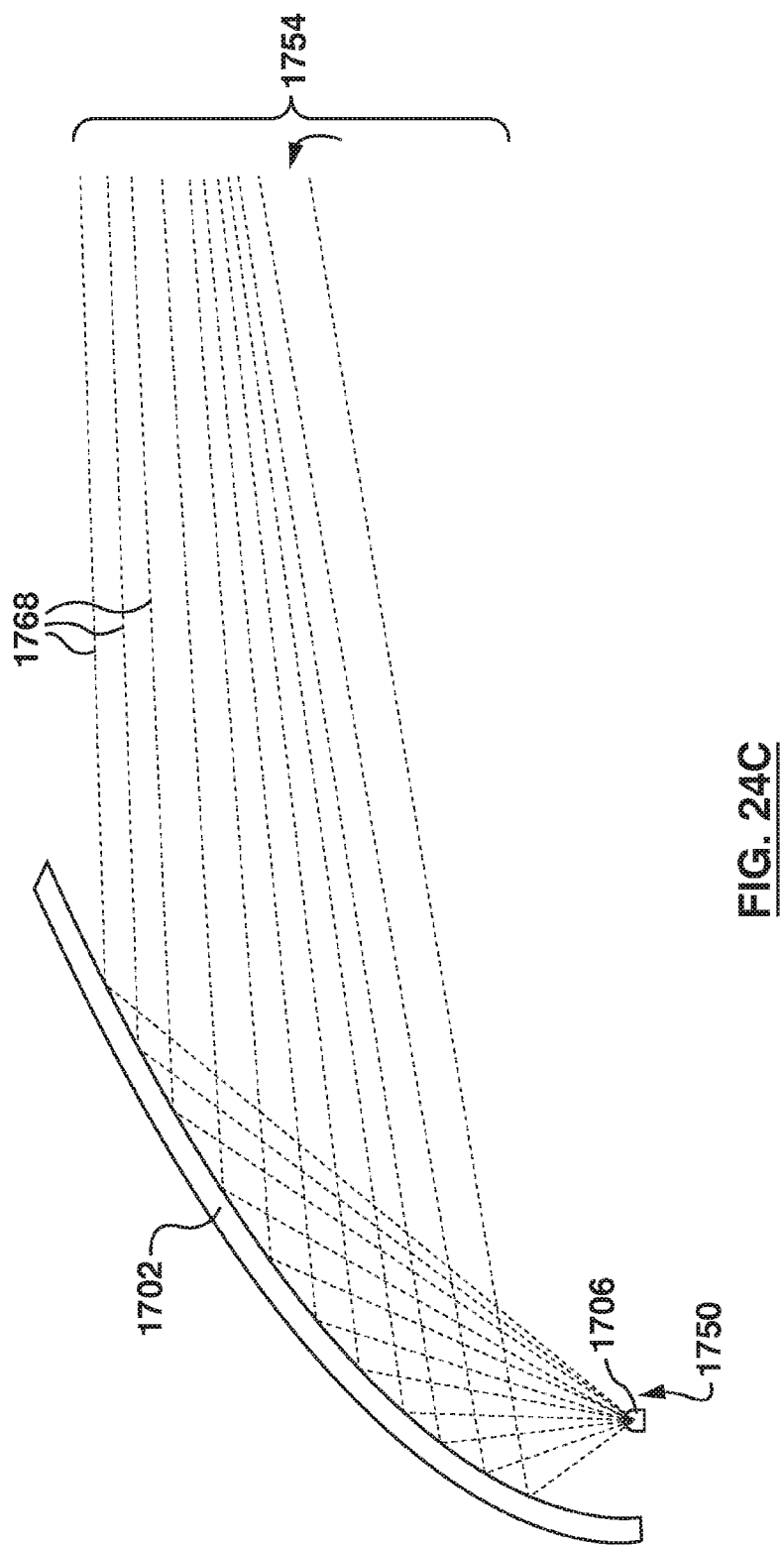

Since the long edge focal line segments 1750L are part of the focus 1750 of the reflector 1702, the reflector 1702 will direct light from the long edge focal line segments 1750L outwardly within the viewing angle range 1754. Because the base color LEDs 1704 are positioned with their optical centers substantially on the long edge focal line segments 1750L, the colored light emitted by the base color LEDs 1704 positioned along the long edge focal line segments 1750L, denoted by dashed lines 1752, will be directed outwardly within the viewing angle range 1754, as shown in FIG. 24A. In contrast, because the additive LEDs 1706 are substantially offset from the long edge focal line segments 1750L, the white light emitted by the additive LEDs 1706 positioned along the long edge focal line segments 1750L may include a portion 1764 (FIG. 24B) of light that is directed outside of the viewing angle range 1754 and does not necessarily extend across the full viewing angle range 1754 (FIG. 24C). FIG. 24B shows the light pattern, denoted by dash-dot-dash lines 1766, generated by the reflector 1702 from the additive LEDs 1706 that are positioned outwardly relative to the printed circuit board 1714. FIG. 24C shows the light pattern, denoted by short-dash lines 1768, produced by the reflector 1702 from the additive LEDs 1706 that are positioned inwardly relative to the printed circuit board 1714. FIG. 10D shows the overall light pattern resulting from the base LEDs 1704 and the additive LEDs 1706 positioned along the long edge focal line segments 1750L.

Figure 24D:
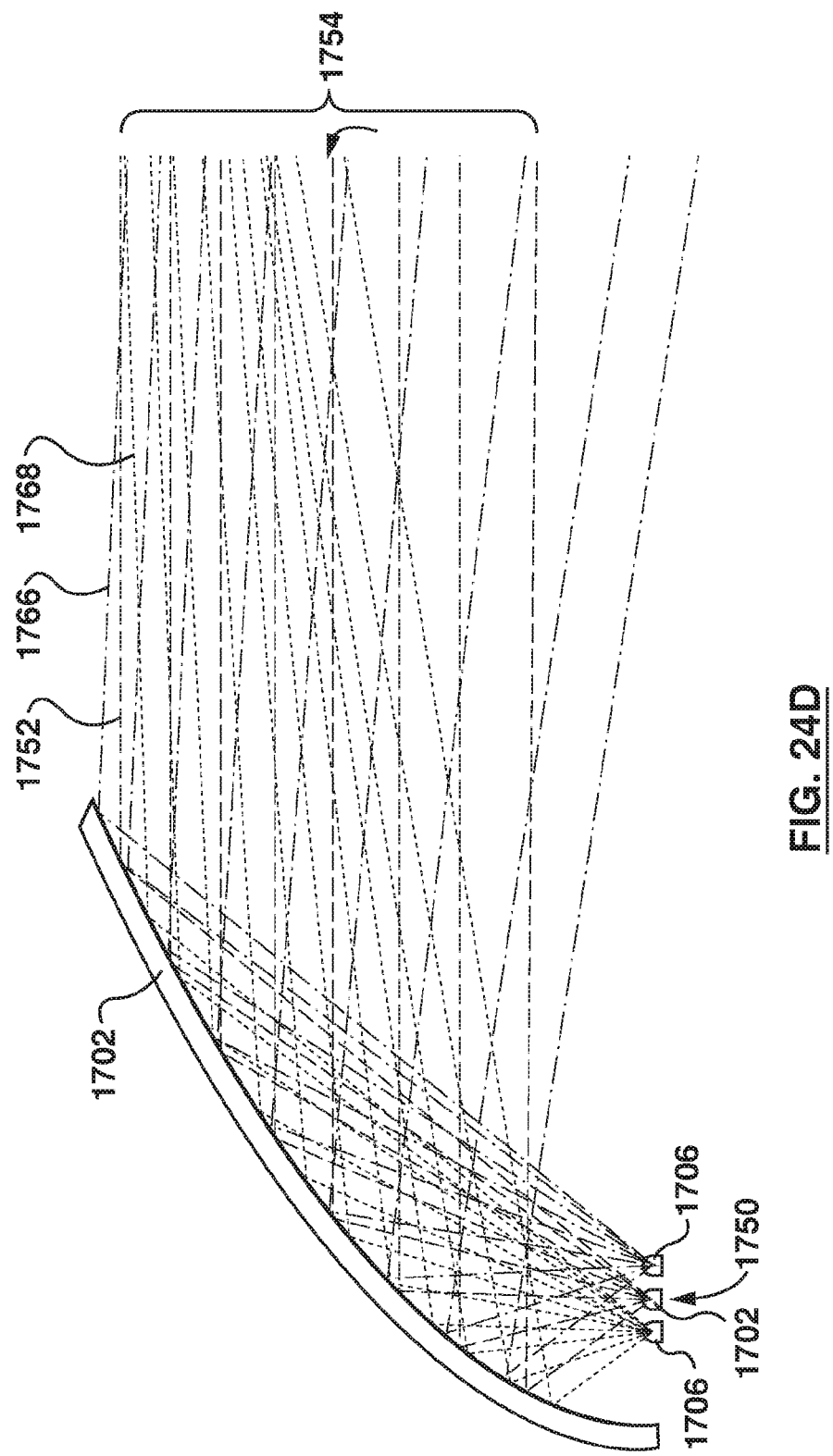

As noted above, one or both of the pillow lens 1708 and the outer enclosure 1710 is tinted so as to also function as a filter. Since both of the pillow lens 1708 and the outer enclosure 1710 are interposed between the LEDs 1704, 1706 and a notional viewer this means that a filter is interposed between the LEDs 1704, 1706 and the notional viewer. The filter integrated into the pillow lens 1708 and/or the outer enclosure 1710 is configured to suppress light outside of the target color region; i.e. the filter acts as a bandpass filter. As can be seen by reference to FIGS. 24A and 24D, the colored light from the base LEDs 1704 (represented by dashed lines 1752) is spread evenly across the viewing angle range 1754 (FIG. 24A) and the region of highest concentration of the overall light pattern overlaps the midpoint 1770 of the viewing angle range 1754 (FIG. 24D). The result of this light pattern, coupled with the effect of the filter in suppressing light from the additive LEDs 1706 that is outside of the target region, is that a dominant portion of the light passing through the filter to the notional viewer at the midpoint 1770 of the viewing angle range 1754 is within the target color region.

Referring again to FIG. 23, the arrangement of the LEDs 1704, 1706 along the short edge focal line segments 1750S and along the diagonal focal line segments 1750D is different from that of the LEDs 1704, 1706 along the long edge focal line segments 1750L.

For each of the short edge focal line segments 1750S, three base color LEDs are positioned substantially on the short edge focal line segment 1750S, with two base color LEDs 1704 occupying the outermost positions (i.e. closest to the diagonal focal line segments 1750D) and one base color LED 1704 occupying the central position (i.e. furthest from the diagonal focal line segments 1750D). One pair of additive LEDs 1706 is positioned between each outermost base color LED 1704 and the central base color LED 1704, for a total of two pairs of additive LEDs 1706 for each of the short edge focal line segments 1750S. Within each pair of additive LEDs 1706, the additive LED 1706 closest to the outermost base color LED 1704 is offset substantially outwardly from the short edge focal line segment 1750S and the additive LED 1706 closest to the central base color LED 1704 is offset substantially inwardly from the short edge focal line segment 1750S.

For each of the diagonal focal line segments 1750D, two base color LEDs 1704 are positioned side-by-side substantially on the diagonal focal line segments 1750D, between two additive LEDs that are offset substantially outwardly from the diagonal focal line segments 1750D.

A first amber minibar light system was constructed according to the above design and was tested under the J845 standard. The tested minibar light system used Lumileds 3535L PC Amber LEDs as the base color LEDs 1704 and used Lumileds 3535L 2700K White LEDs as the additive LEDs 1706. These LEDs are available from Lumileds Holding B.V. having an address at 370 W. Trimble Road, San Jose, Calif. 95131 USA. The control circuit 1716 electrically grouped the LEDs 1704, 1706 into groups 1762 of three adjacent LEDs 1704, 1706, clockwise around the printed circuit board 1714 as shown in FIG. 23, with a total of ten groups 1762 along each long edge focal line segment 1750L. The LEDS 1704, 1706 in each group 1762 were connected in series for a current of 100 mA for each LED 1704, 1706 and each group 1762 was connected in parallel with each other group 1762. The pillow lens 1708 was transparent and the outer enclosure 1710 was formed from Polycarbonate 123R-112 Clear with a 2% amber tint (3MC04671 Trans.LT Orange) so as to function as a filter. Such an outer enclosure is available as part 877221 from SWS Warning Systems Inc. having an address at 7695 Blackburn Parkway, Niagara Falls, Ontario, Canada L2H 0A6.

FIG. 23 shows dimensions and relative spacing for components of the first amber minibar light system 1700, where the dimensions represented by the letters "j" through "q" are given in inches (other than "r" and "s", which are in degrees) in the table below.

| Dimension | Value |
| --- | --- |
| j | 1.254 |
| k | 5.185 |
| l | 5.150 |
| m | 5.185 |
| n | 5.215 |
| o | 1.218 |
| p | 1.254 |
| q | 1.283 |
| r | 45° |
| s | 45° |

This first amber minibar light system passed the J845 Class 1 standard test for color and intensity with the following results:

| Test Point | Measured Intensity (cd) | Minimum Intensity (cd) | Measured Power (cd-sec/min) | Minimum Power (cd-sec/min) |
| --- | --- | --- | --- | --- |
| 5° Up | 95 | 38 | 2744 | 900 |
| 2.5° Up | 228 | 169 | 6513 | 4050 |
| 0° (H-V) | 787 | 338 | 22588 | 8100 |
| 2.5° Down | 388 | 169 | 11195 | 4050 |
| 5° Down | 93 | 38 | 2684 | 900 |

Figure 25:
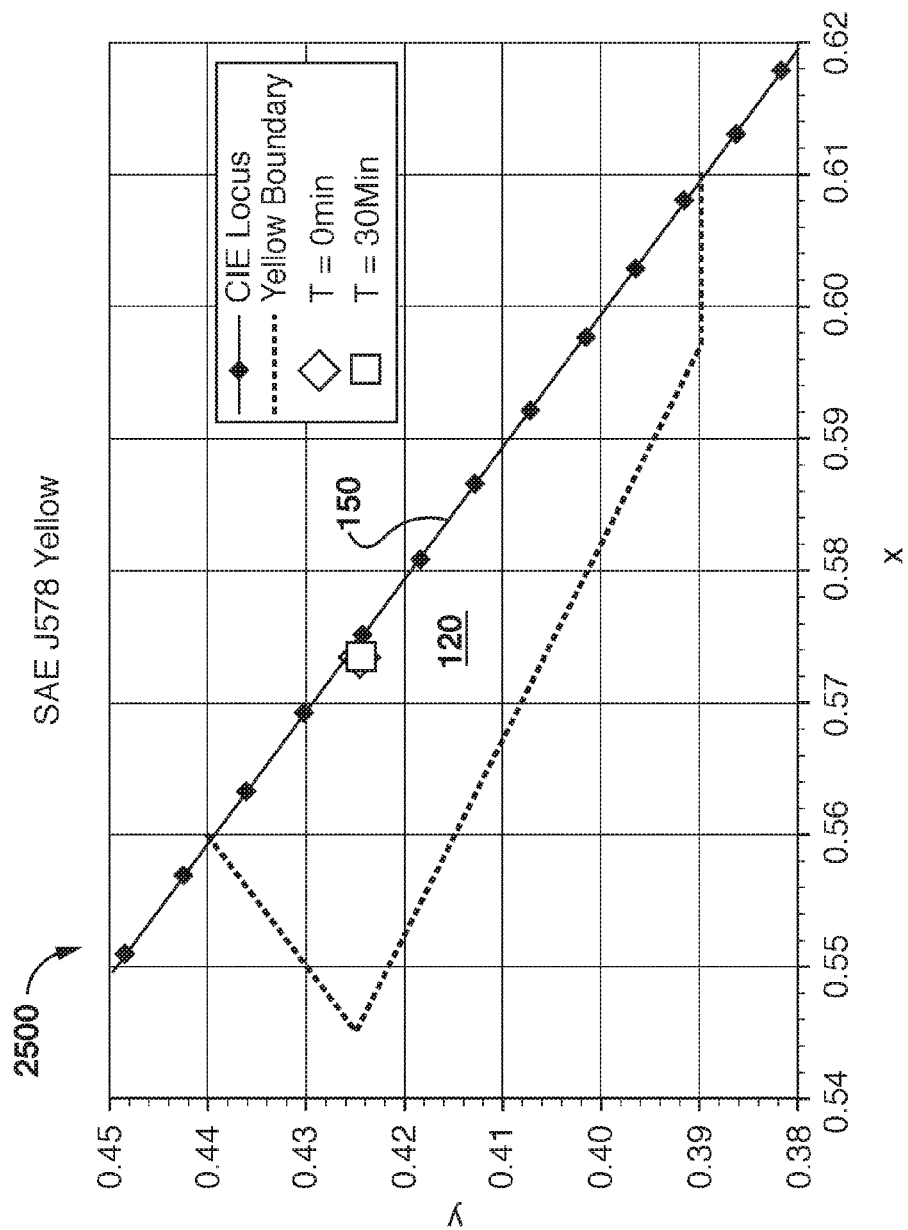
FIG. 25 is a graph showing a portion of the CIE (1931) standard colorimetric system shown in FIG. 1 which includes the yellow (amber) target color region, and showing the position of light produced by a first exemplary amber minibar light system.

FIG. 25 is a graph 2500 showing a portion of the CIE (1931) standard colorimetric system shown in FIG. 1 which includes the yellow (amber) target color region 120, and showing that the light produced by the first amber beacon light system (measured along a longer side of the minibar light system 1700; i.e. along one of the long edge focal line segments 1750L) is entirely within the yellow (amber) target color region 120.

A second amber minibar light system was constructed identically to the first amber minibar light system, except the outer enclosure 1710 was transparent and the pillow lens 1708 was formed from Polycarbonate 123R-112 Clear with an 8% amber tint (3MC04671 Trans.LT Orange). This second minibar light system passed the J845 Class 1 standard test for color and intensity with the following results:

| Test Point | Measured Intensity (cd) | Minimum Intensity (cd) | Measured Power (cd-sec/min) | Minimum Power (cd-sec/min) |
| --- | --- | --- | --- | --- |
| 5° Up | 104.7 | 38 | 3001.9 | 900 |
| 2.5° Up | 266.5 | 169 | 7628.5 | 4050 |
| 0° (H-V) | 741.4 | 338 | 21201.4 | 8100 |
| 2.5° Down | 363.4 | 169 | 10402.6 | 4050 |
| 5° Down | 84.5 | 38 | 2419.8 | 900 |

Figure 26:
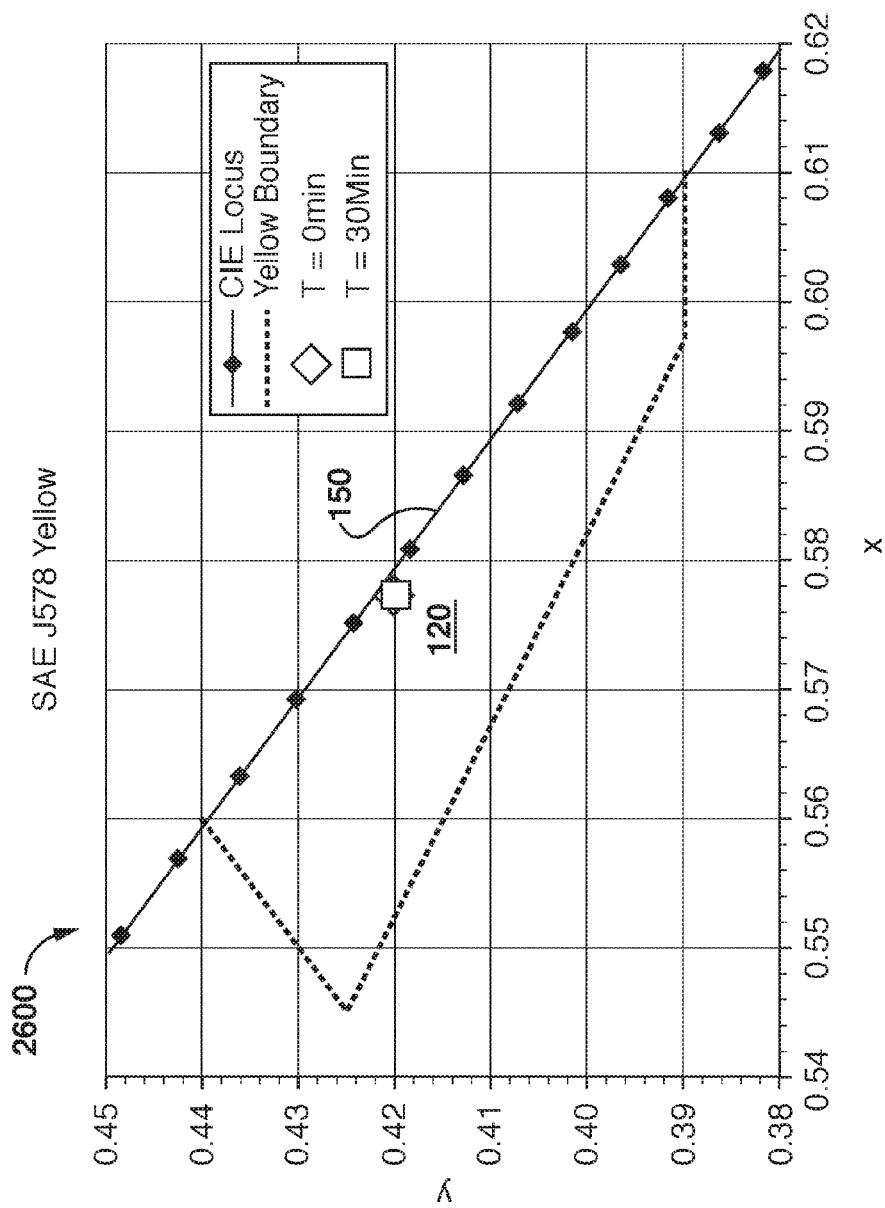
FIG. 26 is a graph showing a portion of the CIE (1931) standard colorimetric system shown in FIG. 1 which includes the yellow (amber) target color region, and showing the position of light produced by a second exemplary amber minibar light system.

FIG. 26 is a graph 2600 showing a portion of the CIE (1931) standard colorimetric system shown in FIG. 1 which includes the yellow (amber) target color region 120, and showing that the light produced by the second amber minibar light system (measured along a longer side of the minibar light system 1700; i.e. along one of the long edge focal line segments 1750L) is entirely within the yellow (amber) target color region 120.

The beacon light system 700 and the minibar light system 1700 are merely exemplary implementations of light systems constructed according to principles of the present disclosure; these principles can be applied to other light systems as well.

In LED light system applications, heat sink arrangements are typically included to assist in temperature control. One exemplary heat sink arrangement for a printed circuit board, and a method for constructing a printed circuit board having such a heat sink arrangement, will now be described with reference to FIGS. 27 and 28A through 28H.

FIG. 27 is a flow chart showing a method 2700 for forming a printed circuit board having a heat sink thereon, and FIGS. 28A through 28H schematically illustrate the steps of the method 2700. It will be appreciated that FIGS. 28A through 28H are not to scale.

At step 2702 (FIG. 28A), an insulating substrate layer 2802 is provided. The insulating substrate layer 2802 may be any suitable material, for example FR-4 glass epoxy as is known in the art.

At step 2704 (FIG. 28B), a trace layer 2804 is formed on the insulating substrate layer 2802. The trace layer 2804 comprises a plurality of conductive traces 2806 and a plurality of solder pads 2808 coupled to the conductive traces 2806. The solder pads 2808 are generally wider than the conductive traces 2806. Any suitable technique may be used to form the trace layer 2804. Typically, the trace layer 2804 is formed by affixing a thin sheet of conductive metal such as copper onto the insulating substrate layer 2802 (alternatively the insulating substrate layer may be provided with a sheet of conductive metal already affixed) and then removing unwanted portions of the sheet to leave the solder pads and conductive traces. Any suitable method may be used to remove the unwanted portions, including applying a protective mask to the sheet (e.g. by screen printing, photoengraving or laser resist ablation) and then using subtractive (e.g. etching), additive or semi-additive methods; alternatively PCB milling or other methods may be used.

At step 2706 (FIG. 28C), an insulating solder mask layer 2810 is adhered over the trace layer 2804 onto the insulating substrate layer 2802, and at step 2708 (FIG. 28D) the solder mask layer 2810 is etched to become an etched solder mask layer 2810E. The solder mask layer 2810 may be a thin layer of an insulating polymer material, and may be etched using photolithography to form openings 2812 (FIG. 28D) that expose the solder pads 2808. Thus, the solder pads 2808 are the portions of the trace layer 2804 that are exposed by the openings 2812 in the etched solder mask layer 2810E.

At step 2710 (FIG. 28E), a solder layer 2814 is screened onto the etched solder mask layer 2810E so that the solder layer 2814 adheres to the exposed solder pads 2808 on the trace layer 2804. The solder layer 2814 forms a plurality of discrete individual solder portions 2822, 2824 that are spaced apart and separate from one another. In a presently preferred embodiment as shown in the Figures, the solder portions 2822, 2824 have a one-to-one relationship with the solder pads 2808, i.e. one and only one solder portion 2822, 2824 on each solder pad 2808. However, in other embodiments the solder portions 2822, 2824 may have a many-to-one relationship with the solder pads 2808, i.e. more than one solder portion 2822, 2824 may be disposed on a single solder pad 2808. Combinations of one-to-one and many-to-one relationships may also be used.

At step 2712 (FIG. 28F), the leads 2816 of electronic components 2818 are positioned on selected solder portions 2822, that is, on a first set of the solder portions 2822, according to the circuit design while leaving a second set of the solder portions 2824 free of any electronic component leads. The electronic components 2818 may include, for example, resistors, capacitors, transistors, diodes, LEDs and integrated circuits, among others.

At step 2714 (FIG. 28G), the printed circuit board assembly, comprising the insulating substrate layer 2802 with the trace layer 2804, etched solder mask layer 2810E, the solder layer 2814 and the electronic components 2818 thereon, is moved into a reflow oven 2820. The reflow oven melts the solder layer 2814, and the solder forming the first set of solder portions 2822 flows between the respective leads 2816 and the respective solder pads 2818. As noted above, the solder portions 2822, 2824 preferably have a one-to-one relationship with the solder pads 2808. Also preferably, as seen in FIG. 28G, the solder pads 2808 on which the solder portions 2824 in the second set of solder portions 2824 are disposed are dimensioned as that when the solder layer 2814 is melted, surface tension of the solder 2824 in the second set of solder portions 2824 draws the solder 2824 into solder balls 2826 having a generally frusto-spherical shape.

At step 2716, the printed circuit board assembly, comprising the insulating substrate layer 2802 with the trace layer 2804, etched solder mask layer 2810E, the solder layer 2814 and the electronic components 2818 thereon, is removed from the reflow oven 2820 to cool and solidify the solder layer 2814, as shown in FIG. 24H. When cooled and solidified, the solder 2822 in the first set of solder portions 2822 physically and electrically couples the leads 2816 to the solder pads 2808 and the solder 2824 in the second set of solder portions 2824 is at least physically and thermally coupled to the solder pads 2808 in on which the second set of solder portions 2824 is disposed; typically they will be electrically coupled as well. Preferably, after cooling and solidifying the solder layer 2814, the solder balls 2826 retain their generally frusto-spherical shape.

Thus, as shown in FIG. 28H, the result of the exemplary method 2700 is a printed circuit board 2800. The printed circuit board 2800 comprises an insulating substrate layer 2802, a trace layer 2804 disposed on the insulating substrate layer, and an etched solder mask layer 2810E disposed on the trace layer 2804. The trace layer 2804 comprises a plurality of conductive traces 2806 and a plurality of solder pads 2808 electrically coupled to the conductive traces. The etched solder mask layer 2810E is disposed on the trace layer 2804 so that the conductive traces 2806 are disposed between the insulating substrate layer 2808 and the etched solder mask layer 2810E, which has a plurality of openings 2812 therein in registration with the solder pads 2808. The solder pads 2808 are exposed by the openings 2812 in the etched solder mask layer 2810E. A plurality of solder portions 2822, 2824 are bonded to the solder pads 2808. The printed circuit board 2800 comprises a plurality of electronic components 2818, and the leads 2816 of the electrical components 2818 are physically and electrically coupled to respective solder pads 2808 by a first set of the solder portions 2822. A second set of the solder portions 2824 is bonded to some of the solder pads 2808, preferably in the form of frusto-spherical solder balls 2826, but the second set of solder portions 2824 is free of any electronic component leads. The second set of solder portions 2824 is thermally coupled via a subset of the conductive traces 2806 to the circuit formed by the conductive traces 2806, solder pads 2808, solder 2822 and electronic components 2818 so as to act as a heat sink; the solder balls 2826 increase the available surface area for dispersing heat into the ambient air. The layout of the conductive traces 2806 is such that the conductive traces 2806 and the second set of solder portions 2824 do not create any undesired electrical bridging.

The second set of solder portions 2824 may have any suitable arrangement. For example, the second set of solder pads 2824 may be arranged in one or more grids on regions of the printed circuit board 2800 not occupied by other components.

Figure 29:
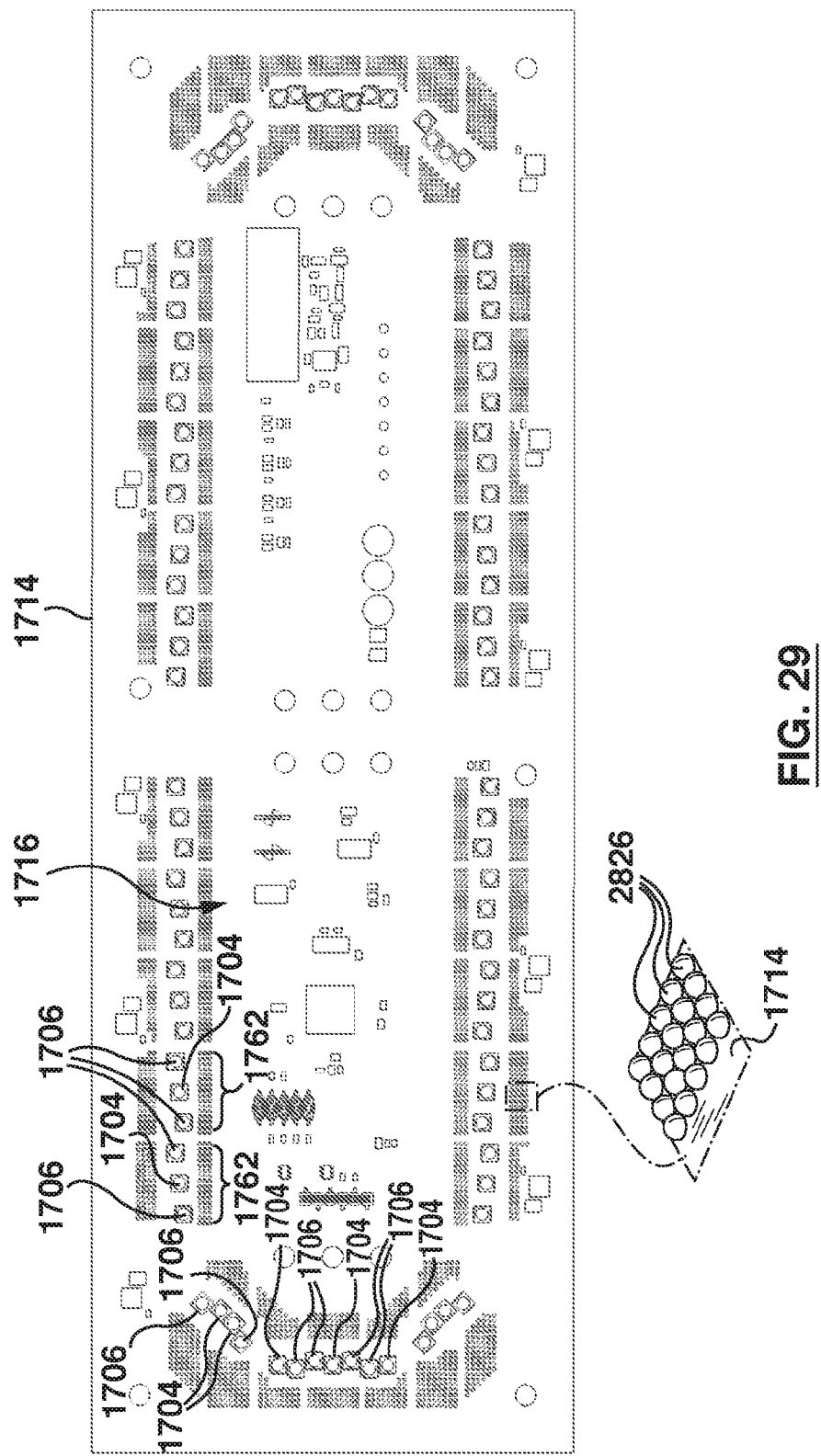
FIG. 29 shows a variant of a printed circuit board of the minibar light system of FIG. 17, the variant including a plurality of solder balls acting as heat sinks.

In one embodiment, the method 2700 may be applied to form heat sinks on a printed circuit board 1714 for the minibar light system 1700 described above. FIG. 29 shows a variant of the printed circuit board 1714 including a plurality of solder balls 2826 acting as heat sinks.

The method 2700 is not limited to light system applications, and may be applied to any suitable printed circuit board requiring a heat sink and, in the case of a two-sided printed circuit board, may be applied to one or both sides.

Certain embodiments have been described by way of example. It will be apparent to persons skilled in the art that a number of variations and modifications can be made without departing from the scope of the claims.

What is claimed is:

1. A light system for projecting light within and limited to a non-white target color region, the light system comprising:

a confining primary optic having a focus and a viewing angle range and configured to direct light from the focus outwardly within the viewing angle range;

at least one base color light emitting diode (LED) positioned substantially on the focus, the at least one base color LED configured to emit light within the target color region;

at least one pair of additive LEDs substantially offset from the focus;

the at least one pair of additive LEDs being associated with and positioned adjacent to a respective base color LED; and within each pair of additive LEDs, one member of the pair is disposed with its optical center on a first side of the focus and the other member of the pair is disposed with its optical center on a second side of the focus opposite the first side of the focus;

the at least one pair of additive LEDs being configured to emit light within a white color region for which a correlated color temperature (CCT) of the light within the white color region is skewed toward the target color region; and a filter interposed between the LEDs and a notional viewer, the filter configured to suppress light outside of the target color region;

wherein a dominant portion of filtered light passing through the filter to the notional viewer at a midpoint of the viewing angle range is within the target color region.

2. The light system of claim 1, further comprising a control circuit coupled to the at least one base color LED and the at least one additive LED for flashing the at least one base color LED and the at least one additive LED.

3. The light system of claim 1, wherein within the at least one pair of additive LEDs:
   each member of the at least one pair has identical photometric output; and
   each member of the at least one pair is disposed with its optical center equidistant from the focus.

4. The light system of claim 1, wherein the primary optic is a reflector.

5. The light system of claim 1, wherein the primary optic is a Fresnel lens.

6. The light system of claim 5, wherein the filter is integral with the Fresnel lens.

7. The light system of claim 1, wherein all of the light emitted from the at least one base color LED is entirely within the target color region.

8. The light system of claim 7, wherein all of the light emitted from the at least one additive LED is entirely within the white color region.

9. The light system of claim 1, wherein all of the light emitted from the at least one additive LED is entirely within the white color region.

* * * * *